US009964581B2

(12) United States Patent
Szatkowski et al.

(10) Patent No.: US 9,964,581 B2
(45) Date of Patent: May 8, 2018

(54) ELECTRICAL CABLE DIAGNOSTIC SYSTEM

(71) Applicant: Instrument Manufacturing Company, Manchester, CT (US)

(72) Inventors: Andrzej Pawel Szatkowski, Bolton, CT (US); Matthew S. Mashikian, Pomfret Center, CT (US)

(73) Assignee: Instrument Manufacturing Company, Manchester, CT (US)

( * ) Notice: Subject to any disclaimer, the term of this patent is extended or adjusted under 35 U.S.C. 154(b) by 506 days.

(21) Appl. No.: 14/505,857

(22) Filed: Oct. 3, 2014

(65) Prior Publication Data

US 2016/0097798 A1    Apr. 7, 2016

(51) Int. Cl.
*G01R 31/02*    (2006.01)
*G01R 31/08*    (2006.01)

(52) U.S. Cl.
CPC ......... *G01R 31/021* (2013.01); *G01R 31/088* (2013.01)

(58) Field of Classification Search
None
See application file for complete search history.

(56) References Cited

U.S. PATENT DOCUMENTS 5,194,817 A * 3/1993 Ward ................. G01R 31/1272
324/544

OTHER PUBLICATIONS

Coors et al, "HV AC Testing of Super-Long Cables", Conference Record of the 2008 IEEE International Symposium on Electrical Insulation, Vancouver, BC, 2008, pp. 636-640 (Published 2008).*
Jaramillo-Vacio et al, "Diagnosis test of power cables using a resonant test system and analysis of partial discharge on site," 12th IEEE International Power Electronics Congress, San Luis Potosi, 2010, pp. 114-117 (Published 2010).*
Gockenbach et al, "The selection of the frequency range for high-voltage on-site testing of extruded insulation cable systems," in IEEE Electrical Insulation Magazine, vol. 16, No. 6, pp. 11-16, Nov.-Dec. 2000 (Published 2010).*

* cited by examiner

*Primary Examiner* — Melissa Koval
*Assistant Examiner* — Felicia Farrow
(74) *Attorney, Agent, or Firm* — McCarter & English, LLP

(57) ABSTRACT

A resonant test system can be configured to adjust an inductance to set the inductance of the resonant test system to a test inductance value and to adjust an output frequency of the resonant test system to set the output frequency to a test output frequency. The inductance of the resonant test system can be adjusted by controlling a reactor of the resonant test system and the output frequency of the resonant test system can be controlled by an inverter of the resonant test system. The test inductance value and the test output frequency the test inductance value and the test output frequency can be automatically and dynamically set by a controller of the resonant test system to achieve resonance in series with an electrical power cable under test. One or more diagnostic tests can be performed on the electrical power cable.

29 Claims, 12 Drawing Sheets

ELECTRICAL CABLE DIAGNOSTIC SYSTEM

TECHNICAL FIELD

Exemplary embodiments of the present disclosure are directed to systems and methods for performing diagnostic testing of power cables, and more particularly, to system and methods including a resonant test set having an adjustable inductance and output frequency.

BACKGROUND

Installed electrical power equipment is often subjected to diagnostic tests, such as partial discharge tests, requiring high alternating voltage at power frequency. Although power frequency is sometimes defined as any frequency in the range of 20 Hz to 300 Hz, in reality, most if not all terrestrial electrical equipment operate at either 50 Hz or 60 Hz. A diagnostic test conducted at a voltage having a steady amplitude and a frequency in the range of 50 Hz to 60 Hz is, therefore, most desirable, as it duplicates the day-to-day operating condition of the installed equipment. Thus, standard alternating voltage tests conducted in the factory by equipment manufacturers use power frequency sources that have steady alternating voltage at 50 Hz or 60 Hz.

Conventional power frequency voltage sources used in factories for high voltage tests consist in relatively heavy and bulky transformers that are not practical for transportation to the field where installed equipment needs to be tested. Fortunately, when the installed electrical equipment to be tested can be considered as an electrical capacitor, as is clearly the case for a power cable, it is possible to use a resonant test set to generate the desired test voltage. While conventional test sets are often significantly smaller and lighter than power frequency voltage sources of the same rating used in a factory, these conventional test sets are still generally heavy and bulky and often require a large, heavy-duty truck for transportation to the field. As a result, conventional test sets can be expensive to transport (due to, for example, fuel consumption and government regulations). In addition, it is often the case that the source voltage of these conventional test sets is generated directly from the engine of the trucks adding additional wear and tear to the engine resulting in higher maintenance costs for the trucks. The test voltages generated using this configuration can also be unstable due to changes in the operation of the engine and a response of the engine to the additional loading of the test sets and the cables under test.

In principle, a resonant test set consists of a relatively small alternating voltage source (with a voltage and power rating in the order of 1/25th to 1/50th of voltage and power rating of the test set) connected in series with an inductor (reactor) and the power cable to be tested. If L is the inductance of the reactor, C the capacitance of the cable, and f the frequency of the voltage source, resonance is said to be achieved when $2\pi fL = 1/(2\pi fC)$. Under resonance conditions, the voltage across the test cable becomes a large multiple, Q, of that of the alternating voltage source. The multiple Q, also called the quality of the circuit, is usually in the range of 25-75. Thus, starting with a modest voltage magnitude of 1 kV, it is possible to generate approximately 25 to approximately 75 kV. As a length of the test cable increases, the capacitance of the cable increases proportionally. In order to achieve resonance, the inductance L and/or the frequency f have to be decreased accordingly.

There are generally two conventional types of resonant test sets: (a) sets with constant frequency but variable inductance; and (b) sets with constant inductance but variable frequency. An example of a conventional resonant test set with a constant frequency but variable inductance can include a variable inductance reactor having a high voltage winding, sometimes split over two coils built around one or two legs of a split magnetic core formed by two U-shaped magnetic paths facing each other across open air gaps. While one of these U-shaped cores is stationary, the other is connected to mechanical actuators which allow the gap to open or close. The entire assembly, including the mechanical actuators and the opposing U-shaped cores, is often housed in a relatively large metal tank, normally filled with insulating oil. The forces of electromagnetic origin on the faces of the core across air gaps tend to dictate mechanical and structural designs which result in heavy core assemblies. When testing objects of small capacitance, such as short cables, resonance while using these conventionally test sets cannot be achieved, and complex schemes often have to be incorporated in the test set to work around this limitation. In one of the schemes, the reactor is connected in parallel with the cable under test, while allowing the test set to function as an auto-transformer. Furthermore, with cables having large capacitances, the air gap of reactors used in conventional test sets is forced to assume large values (e.g., on the order of 15 cm or more). This, in turn, requires such conventional test sets to be much larger (and heavier) than desired for field testing.

An example of a conventional resonant test set with a variable frequency, but fixed reactor inductance, often includes a voltage source of variable frequency. In order to achieve resonance with cables spanning a few hundred meters to several kilometers, as encountered in commercial cable installations, it is often necessary to operate these conventional test sets within a relatively large range of frequencies, such as 20 Hz to over 300 Hz, resulting in an operation undesirably removed from normal operation at 50 or 60 Hz.

SUMMARY

To overcome the problems associated with conventional resonant test sets, exemplary embodiments of the present disclosure advantageously provide for hybrid resonant test systems that can be operable to adjustably control both an inductance of the resonant test system and an output frequency of the resonant test system to advantageously perform diagnostic testing of electrical power cables over a wide range of lengths and capacitances. Exemplary embodiments of the resonant test systems can include a resonant test set that achieves diagnostic testing of electrical power cables over a wide range of lengths and capacitances, while improving the stability of the resonant test set and reducing the size and weight associated with exemplary embodiments of the resonant test sets as compared to conventional resonant test sets. The reduction in size and weight of the resonant test sets of the exemplary embodiments of the present disclosure advantageously allow the resonant test set to be installed in smaller, more efficient vehicles than conventional resonant test sets allowing for reduced operating costs.

In accordance with embodiments of the present disclosure, a method of conducting diagnostic testing of electrical cables using a resonant test set and a non-transitory computer-readable medium storing instructions, wherein execution of the instructions by a processing device causes the processing device to implement the method for diagnostic testing of an electrical cable are disclosed. The method includes adjusting an inductance of the resonant test set to set the inductance of the resonant test set to an inductance value, and adjusting an output frequency of the resonant test set to set the output frequency to a test frequency. The test inductance value and the test frequency are set to achieve resonance in series with an electrical cable under test. The method also includes performing diagnostic testing of the electrical cable with the resonant test set at the inductance test value and the test frequency value. In exemplary embodiments, the resonant test set can be configured to operate in a power frequency range of approximately fifty hertz to approximately sixty hertz.

In accordance with embodiments of the present disclosure, a resonant test system for diagnostic testing of electrical cables is disclosed that includes an inverter, an exciter, a reactor, and a processing device. The inverter is configured to receive a direct current (DC) voltage at an input and to output an alternating current (AC) voltage at an output. The exciter is operatively coupled to the inverter and amplifies an amplitude of the AC voltage. The reactor has an input that is operatively coupled to the exciter and an output that is configured to be operatively coupled to an electrical cable. The processing device is operatively coupled to the inverter and the reactor and is programmed to adjust an inductance of the reactor and an output frequency of the inverter to achieve resonance in series with the electrical cable. An output frequency of the inverter can be decreased or increased until resonance is achieved.

In accordance with embodiments of the present disclosure, an output frequency of the resonant test set can be set to a first frequency value prior to adjusting the inductance of the resonant test set, wherein the output frequency is controlled by the inverter in response to a processing device to output the first frequency value from the inverter. A feedback signal associated with the output from the inverter can be used to determine if the output frequency corresponds to the first frequency value, and the output frequency of the inverter can be adjusted to be the first frequency value in response to determining that the feedback signal does not correspond to the first frequency value.

In accordance with embodiments of the present disclosure, a capacitance of the electrical cable can be estimated, prior to adjusting the inductance of the resonant test set, based on at least one of user input or electrical measurement of the electrical cable. The test inductance value can be determined at least in part based on the estimated capacitance and the first frequency value.

In accordance with exemplary embodiments of the present disclosure, the inductance of the resonant test set can be adjusted based on feedback signals associated with the inductance of the reactor to determine whether the inductance of the reactor corresponds to a minimum phase angle by the processing device, and the inductance of the reactor can be adjusted to the test inductance value when the feedback signals do not correspond to the test inductance value.

In accordance with embodiments of the present disclosure, the reactor can have a split magnetic core that includes a first core segment and a second core segment that is moveable with respect to the first core segment. To adjust the inductance, control signals can be transmitted to an actuator of the reactor to adjust a distance between the first and second core segments until the test inductance value is achieved. The distance between the first and second core segment can be adjustable between approximately a tenth of a centimeter and approximately five centimeters. The inductance of the reactor can be approximately four hundred Henries when the distance is set to approximately one tenth of a centimeter and is approximately fifteen Henries when the distance is set to approximately five centimeters.

In accordance with embodiments of the present disclosure, a DC power source can be operatively coupled to an input of the inverter. The DC power source can be a rechargeable battery configured to be recharged by an operation of a combustion engine of a field vehicle within which the resonant test system is installed. a filter operatively coupled to, and in series with, the output of the inverter and an input of the exciter, the filter being configured to filter the output of inverter.

Any combination or permutation of embodiments is envisioned. Other objects and features will become apparent from the following detailed description considered in conjunction with the accompanying drawings. It is to be understood, however, that the drawings are designed as an illustration only and not as a definition of the limits of the invention.

DETAILED DESCRIPTION

Exemplary embodiments of the present disclosure are related to diagnostic testing of electrical power cables. Exemplary embodiments can include resonant test system that includes a resonant test set, which is capable of performing diagnostic testing electrical power cables having a wide range of lengths and capacitances. The resonant test sets can have a variable inductance as well as a variable output frequency to accommodate the different capacitances associated with electrical power cables. For example, in exemplary embodiments of the present disclosure, the inductance of the resonant test set can be controlled to coarsely approximate resonance based on an estimated capacitance of an electrical cable to be tested and the output frequency of the resonant test set can be controlled to finely tune the output of the resonant test set to achieve resonance or near resonance. One or more diagnostic tests can be performed on the electrical power cable (e.g., according to a test profile) when resonance or near resonance is achieved by the circuit formed by the resonant test set and the electrical power cable.

Figure 1:
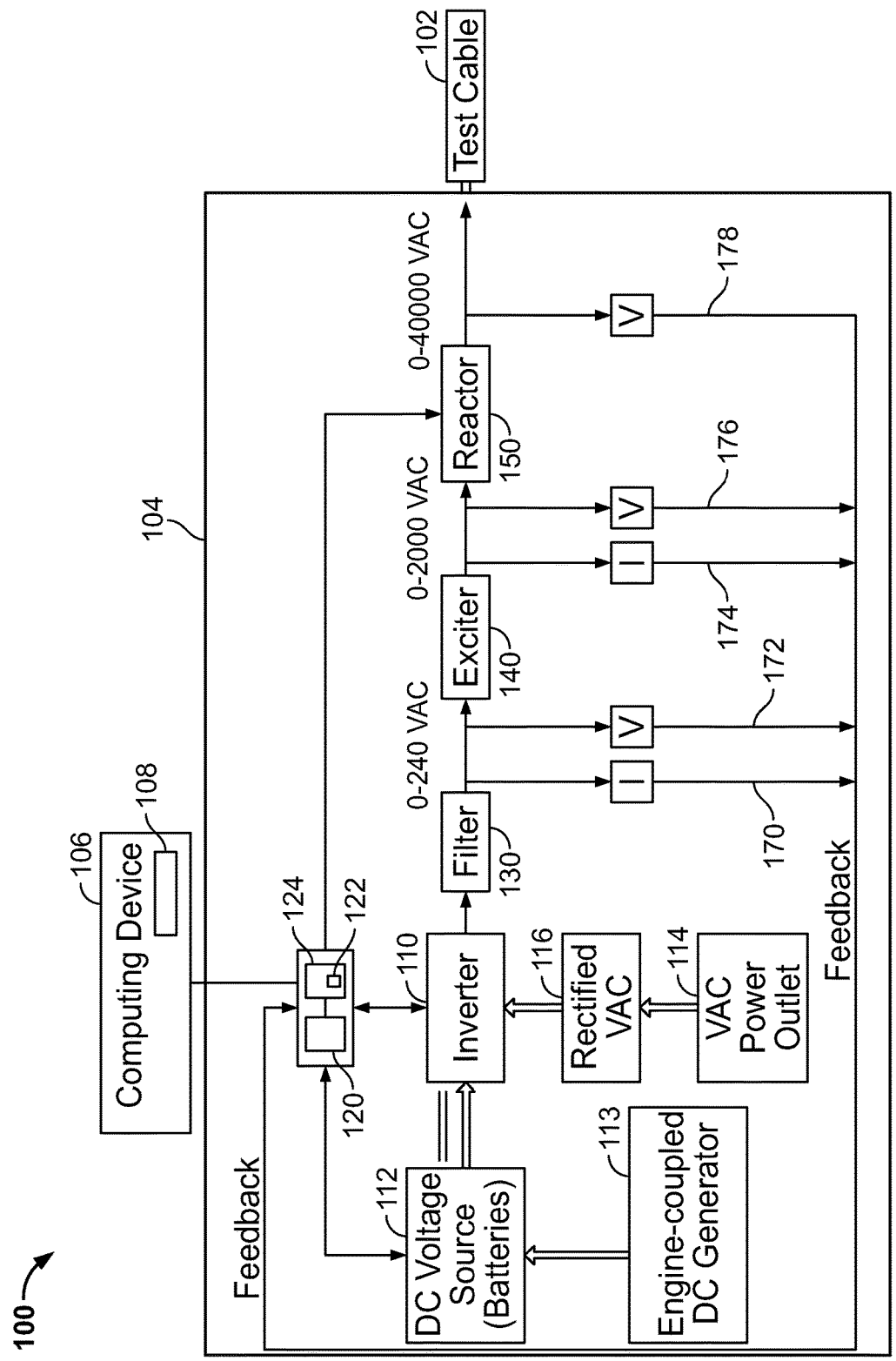
FIG. 1 is a block diagram of a hybrid resonant test system in accordance with exemplary embodiments of the present disclosure.

FIG. 1 is a block diagram of a hybrid resonant test system 100 in accordance with exemplary embodiments of the present disclosure. The hybrid resonant test system 100 can be implemented to perform diagnostic testing of capacitive loads, for example, in the form of electrical cables (e.g., electrical cable 102). The electrical power cables that can be tested using the test system 100 can vary in length, conductor diameters, insulation type, voltage class, and can have different capacitance values, which can be accommodated by the test system 100 when performing diagnostic testing of the electrical power cables. As a non-limiting example, the diagnostic testing performed by the resonant test system 100 can include, for example, partial discharge tests between approximately fifty (50) to approximately sixty (60) hertz and a voltage of approximately zero (0) to approximately two-hundred fifty (250) kilovolts. The frequency range of approximately fifty (50) to approximately sixty (60) hertz, which is referred to herein as a "power frequency" range, generally corresponds to a frequency of the voltage signals that are transmitted through utility power cables. While exemplary embodiments of the present disclosure are described using non-limiting examples of operating frequencies and voltages as well as inductances of the hybrid resonant test system 100, exemplary embodiments of the present disclosure can be implemented using different operating frequencies and at different voltages, although exemplary embodiments that utilize the power frequency range can advantageously provide for diagnostic tests that more closely reflect an actual use of electrical power cables in the field than other frequency ranges.

As shown in FIG. 1, the resonant test system 100 can include a resonant test set 104 and a computing device 106 operatively coupled to the resonant test set 104. The resonant test set 104 can include an inverter 110 that receives a direct current (DC) voltage input from either a DC voltage source 112 (e.g., one or more rechargeable batteries) or from an AC power source 114 (e.g., an AC power outlet, such as a 120 volt AC wall outlet) after the AC voltage of the AC power source 114 has passed through a rectifier 116 to convert an AC voltage signal from the AC power source to a DC voltage. In some embodiments, the DC voltage source 112 can be formed using Lithium Ion Phosphate cells. Recharging of the DC voltage source 112 can be performed directly from an alternator of a vehicle within which the resonant test system is disposed, from a stationary electrical outlet connected to a utility network (e.g., an electrical grid), from solar panels mounted on the field vehicle, or from any combination thereof.

An operation of the inverter 110 can be controlled by a processing device 120. For example, the processing device 120 can execute firmware 122 stored in memory 124 (i.e. a non-transitory computer readable medium) operatively coupled to the processing device 120 to control the inverter 110 based on input received from the computing device 106 operated by a user and/or based on inputs received from one or more feedback circuit paths as described herein. In exemplary embodiments, the processing device 120 and memory 124 can be packaged as stand-alone components or integrated into a controller or microcontroller. In some embodiments, the firmware 122 can be integrated with the application 108 such that the computing device 106 can directly communicate with and control the inverter 110 and the reactor 150 and the computing device 106 can directly receive the feedback signals. In such embodiments, the processing device 120 and memory 124 may omitted from the resonant test set 104.

The inverter 110 can convert the DC voltage to an AC test signal that can be output by the inverter 110. The AC test signal output by the inverter 110 can be an AC voltage having a frequency (i.e. an output frequency of the inverter 110) that is controlled by the processing device 120. For example, in exemplary embodiments, the processing device 120 can execute the firmware 122 to control the inverter 110 such that the inverter 110 outputs the AC test signal at a frequency associated with the power frequency range. In exemplary embodiments, an amplitude of the AC test signal output by the inverter 110 can be controlled by the processing device to be between, for example, approximately zero (0) volts to approximately two-hundred forty (240) volts AC such that the inverter 110 can be controlled to adjust a frequency and amplitude of the AC test signal.

The output of the inverter 110 can be input to a filter 130. In exemplary embodiments, the filter 130 can be formed as a low-pass filter configured to filter high frequencies from the AC test signal output by the inverter 110 (e.g., frequencies greater than the output frequency of the inverter 110). For example, in some embodiments, the output of the inverter 110 can include high frequency noise or harmonics (e.g., due to switching of transistors that form a portion of the inverter 110). The filter 130 can be implemented using one or more passive components (e.g., resistors, capacitors, inductors) and/or one or more active components (e.g., transistors, operational amplifiers).

The exciter 140 can be implemented as a step-up transformer, which receives the filtered AC test signal from the filter 130. Upon receiving the filtered AC test signal, the exciter 140 can increase the amplitude of the filtered AC test signal to an intermediate amplitude in the test set 104. For example, in exemplary embodiments, the filtered AC test signal can have an amplitude of approximately zero (0) to approximately two-hundred forty (240) VAC and the exciter 140 can transform the amplitude of the AC test signal to an amplitude of approximately zero (0) to approximately two thousand (2,000) VAC, while maintaining the output frequency of the AC test signal set by the inverter 110.

An output of the exciter 140 can be operatively coupled to a reactor 150, which can form a variable inductor of the resonant test set 104. The AC test signal, output the exciter 140 with the intermediate voltage amplitude, can be received by an input of the reactor, and an output of the reactor 150 can form an output of the resonant test set 104 that can be operatively coupled in series to an electrical power cable to be tested (e.g., electrical power cable 102). In exemplary embodiments, the inductance of the reactor 150 can be controlled by the processing device 120 (e.g., upon execution of the firmware 122) based on inputs received from a computing device 106 operated by a user and/or based on inputs received from one or more feedback circuit paths, as described herein. The cable under test (e.g., electrical power cable 102) can have a capacitance associated therewith, such that the resonant test set 104 and the electrical power cable 102 can form a resonant circuit.

To achieve resonance, the frequency of the AC test signal set by the inverter 110 and the inductance of the reactor 150 can be tuned by the processing device 120, executing the firmware 122, in response to feedback signals received by the processing device 120 from one or more nodes in the resonant test set 104. For example, current feedback 170 and voltage feedback 172 from the output of the filter 130 can be provided to inputs of the processing device 120; current feedback 174 and voltage feedback 176 from the output of the exciter 140 can be provided to inputs of the processing device 120; and voltage feedback 178 from the output of the reactor 150 can be provided to inputs of the processing device 120. The inductance of the reactor 150 can be adjusted to coarsely approximate resonance and the output frequency of the inverter 110 can be adjusted to finely tune the circuit to achieve a resonance or near resonance condition. When resonance is achieved, the AC test signal output by the resonant test set 104 and through the capacitive load formed by the electrical power cable 102 can have an amplitude that corresponds to an operating voltage associated with the cable and/or one or more test voltages specified by the manufacturer of the cables. As a non-limiting example, the amplitude of the AC test signal output by the resonant test set 104 can be approximately zero (0) to approximately two hundred fifty thousand (250,000) volts AC due to the quality factor (Q) of the resonant circuit formed by the resonant test set 104 and the electrical power cable at the output frequency. The inductance of the reactor 150 required to achieve resonance is referred to herein as the "test inductance value" and the frequency of the AC test signal (e.g., the output frequency of the inverter 110) to achieve resonance is referred to herein as the "test frequency value."

The processing device 120 can execute the firmware 122 to process the current and voltage feedback from various nodes in the test set to control the output frequency of the inverter 110, the amplitude of the output of the inverter 110, and/or the inductance of the reactor 150. As one example, the processing device 120 can be programmed to receive the current feedback 170 and/or the voltage feedback 172 from the output of the filter 130 to monitor the frequency and amplitude of the AC test signal output by the inverter 110, and to adjust the operation of the inverter 110 to change the frequency and/or amplitude of the AC test signal to conform to a value specified by a user via the computing device 130 and/or to achieve a stable frequency and/or amplitude of the AC test signal (e.g., to ensure that the inverter output reflects an expected or programmed inverter output). If the processing device 120 detects that the frequency or amplitude of the AC test signal being output by the inverter 110 does not correspond to the expected or programmed frequency and amplitude, the processing device 120 can execute the firmware 122 to control the inverter 110 to drive the inverter 110 to the expected or programmed frequency and amplitude based on the current and/or voltage feedback 170 and 172. As another example, the processing device 120 can be programmed to receive the current feedback 174 from the output of the exciter 140 to determine a load capacitance associated with the electrical cable, e.g., based on a measuring the electrical current at the input of the reactor 150. As another example, the voltage feedback 176 can be used to monitor an amplitude of the voltage of the resonant test signal input to the reactor and can be used to limit the amplitude. For example, the processing device 120 can be programmed to limit or restrict the amplitude of the voltage of the resonant test signal and the voltage monitored by the voltage feedback 176 can be used by the processing device 120 to determine whether the amplitude of the voltage is less than or greater than the specified voltage. The voltage feedback 176 can also be used in combination with the voltage feedback 178 to determine a quality factor of the resonant circuit formed by the series connection between the resonant test set 104 and the electrical power cable 102. As another example, the processing device can execute the firmware to receive the current feedback 174 from the output of the exciter 140 and the voltage feedback 178 from the output of the reactor 150 to achieve resonance by adjusting the inductance of the reactor 150 to be the test inductance value and by adjusting the frequency of the output of the inverter 110 to be the test frequency value based on the estimated capacitance of the electrical power cable under test. In exemplary embodiments, the test inductance value can be achieved by adjusting the inductance of the reactor 150 until a minimum phase angle is achieved as determined by the output voltage, as measured through voltage feedback 178, and the output current, as measured by the current feedback 174. That is, the inductance of the reactor 150 can be adjusted until an absolute value of phase angle is closest to zero, at which point the reactor 150 stops adjusting the inductance of the reactor 150. After the inductance of the reactor 150 is set, the processing device can execute the firmware to achieve the test frequency value by adjusting the output frequency of the inverter 110 until a maximum output voltage and minimum output current is achieved as measured by the voltage feedback 178 and the current feedback 174, respectively.

The computing device 106 can be programmed to provide a user interface to allow users to interact with the resonant test set 104. For example, in exemplary embodiments, the computing device 106 can execute a diagnostic testing application 108 to display one or more graphical user interfaces. The graphical user interface can allow the user to input information for processing by the diagnostic testing application and/or which can be used the computing device to interact with the resonant test set 104 to control an operation of the resonant test set 104 (e.g., via the processing device 120) and perform one or more diagnostic tests on electrical power cables, such as a partial discharge test. The computing device 106 can receive data (e.g., electrical measurements) from the resonant test set 104, which can be stored by the computing device 106. For example, the computing device 106 can receive, from the processing device 120, electrical measurements corresponding to a diagnostic tests performed by the resonant test set 104 (e.g., diagnostic testing results). In some embodiments, the computing device 106 can execute the diagnostic testing application 108 to transmit, through wires or wirelessly, diagnostic testing results over a communications network to a remote computing device for processing of the diagnostic testing results.

In some embodiments, the diagnostic testing application 108 can reside on and/or be executed by a server remote from the computing device 106 and the user interface of the diagnostic testing application can be rendered on an electronic display unit of the computing device. Data can be transmitted between the server and the resonant test set 104 through the computing device 106, and the server can be configured to control the resonant test set 104 through the computing device 106.

The diagnostic testing application 108 can be programmed to access a database of test profiles corresponding to specific cable types to allow users of the application 108 to select a test profile to be used during the diagnostic testing of cables. The test profiles can specify voltages at which the cables should be tested as well as a duration of time for which the cables should be tested at the specified voltages. After the user selects a test profile, and initiates the diagnostic testing of a cable via the resonant test set 104, the computing device executing the application 108 can interface with the processing device 120 to instruct the processing device to control the inverter 110 and the reactor 150 according to the selected test profile such that the resonant test set is programmatically controlled by the application to automatically test the cable at each of the test voltages for the specified duration of time.

FIGS. 2-8 are a schematic diagrams of an exemplary embodiments of resonant transformers, and coil arrangements for resonant transformers, that can be utilized to implement the reactor 150 shown in FIG. 1. Exemplary embodiments of reactors that can be utilized to implement the reactor 150 are described in more detail in U.S. application Ser. No. 14/505,872, entitled "Resonant Transformer", filed on Oct. 3, 2014, the disclosure of which is incorporated herein by reference in its entirety.

Figure 2:
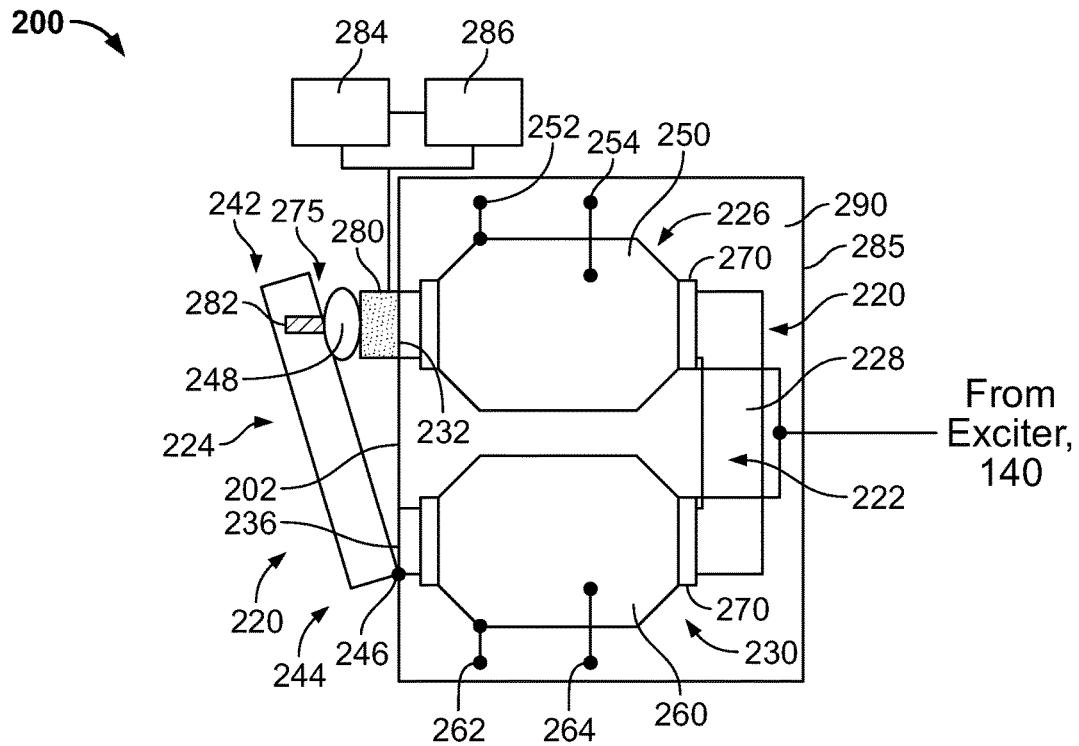
FIGS. 2-4 are schematic diagram of resonant transformers that can form a reactor of a resonant test set in accordance with exemplary embodiments of the present disclosure.

Referring to FIG. 2, a resonant transformer 200 can include a magnetic core 220 having a first core segment 222 and a second core segment 224. The core 220 of the resonant transform 200 can have a U/I configuration, where the core segment 222 can have a U-shape and the core segment 224 can have an I-shape. The core segment 222 can have a first leg 226 with a terminal end 232 and a second leg 230 with a terminal end 236. Conductor coils or windings 250 and 260, which can be disposed, wound, or wrapped about a core mandrel 270 disposed over the first and second legs 226 and 230 of the core segment 222. The legs 226 and 230 can be coupled to each other at one end by a magnetic member 228. In an exemplary operation, the core 220 can be electrically coupled to ground. The resonant transformer 200 can be configured to have an adjustable inductance and to output high voltages (e.g., kilovolts, tens of kilovolts, hundreds of kilovolts) in response to an input voltage (e.g., an input voltage received by an exciter 140). In exemplary embodiments, the coils 250 and 260 can include as many turns as necessary to achieve a desired voltage at an output of the resonant transformer 200. In some embodiments, the coils 250 and 260 can be electrically coupled to each other in parallel or series as described herein.

As shown in FIG. 2, the coil 250 can include output taps 252 and 254, and the coil 260 can include output taps 262 and 264. While coils 250 and 260 have been illustrated as each including two taps, those skilled in the art will recognize that the coils 250 and 260 can include more or fewer taps. Each of the taps 252 and 254 can be electrically coupled to the coil 250 at different locations on the coil 250, and each of the taps 262 and 264 can be electrically coupled to the coil 260 at different locations on the coil 260. The different tap locations correspond to a different number of turns in the coil such that the resonant transformer 200 can be configured to output different voltages at each tap in response to the same input voltage. Because the tap locations correspond to a different number of turns in the coils 250 and 260, an inductance of the resonant transformer 200 associated with each of the tap locations on the coils can be different.

The coils 250 and 260 can be electrically coupled to each other in parallel such that each of the coils 250 and 260 can receive the same input voltage (e.g., from the output of the exciter 140). In exemplary embodiments, the coils 250 and 260 can be formed to be substantially similar or identical (e.g., can each include the same number of turns using the same type of wire), and the taps 252 and 262 can correspond to substantially identical tap locations on the coils 250 and 260 such that when the taps 252 and 262 are used (for parallel coils 250 and 260), the coils 250 and 260 can be configured to have substantially identical inductances and to output substantially identical voltages in response to the same input voltage. Likewise, the taps 254 and 264 can correspond to substantially identical tap locations on the coils 250 and 260 such that when the taps 254 and 264 are used (for parallel coils 250 and 260), the coils 250 and 260 can be configured to have substantially identical inductances and to output substantially identical voltages in response to the same input voltage. In exemplary embodiments, when the coils 250 and 260 are connected in parallel, either of the coil 250 or 260, or both of the coils 250 and 260, can be operatively coupled to a cable to be tested (e.g., tap 252 can be electrically coupled to a cable to be tested or taps 252 and 262 can be electrically coupled to the cable in parallel). Using the coils 250 and 260 in parallel can allow the resonant transformer to operate at higher current ratings than using a single coil because the output current is divide over the two coils and can be used to change a range of inductances that can be achieved by the resonant transformer 200.

In some embodiments, the resonant transformer 200 can be configured to electrically couple the coils 250 and 260 in series such that the output from the coil 250 forms the input to the coil 260. In some embodiments, the resonant transformer 200 can be reconfigurable to switch between a parallel and series arrangement of the coils 250 and 260. To connect the coils 250 and 260 in series, the input to the coil 250 can be connect to the output of the exciter 140 and the tap 252 can be connected to input of the coil 260 such that an output of the coil 250 forms the input to coil 260. In a series configuration the voltages and inductances of the coils 250 and 260 are additive to each other.

In exemplary embodiments, the core segment 222 and coils 250 and 260 can be disposed within a housing 285, while the core segment 222 can be disposed internal or external to the housing 285. Placing the core segment 224 external to the housing 285 such that a wall 202 of the housing 285 separates the core segments 222 and 224, allows a gap between the core segments 222 and 224 to be positioned outside of the housing 285. The second end 244 of the core segment 224 can be operatively coupled to a wall 202 of the housing 285 by a joint 246 (e.g., a hinge, a ball and socket joint, ratchet mechanism, and/or any other suitable pivoting or rotating structure), and the first end 242 of the core segment 224 can be moved away from or towards the terminal end 232 by operation of the joint 246 (e.g., between a first position and a second position) to adjust an inductance of the resonant transformer. For example, a distance between the first end 242 of the core segment 224 and the terminal end 232 of the first leg 226 of the core segment 222 can be varied to change the size of a gap 275 to control an inductance of the resonant transformer 200. As one example, the first end 242 can be moved to be positioned proximate to terminal end 232 to define a minimum gap size or can be moved away from (or further away from) the terminal end 232 to increase the size of the gap 275 (e.g., to a maximum gap size or an intermediate gap size) and adjust the inductance of the resonant transformer 200.

By positioning the core segment 224 (and the gap 275) outside of the main housing 285, exemplary embodiments of the present disclosure can substantially reduce the dimensions of the main housing as compared to tank housings of conventional resonant transformers that are suitable for producing high voltages (e.g., tens or hundreds of kilovolts), which can result in a smaller and lighter resonant transformer than conventional resonant transformer designs. The core segment 224 can be exposed to the atmosphere at atmospheric pressure. In some embodiments, the core segment 224 can be disposed within a secondary housing or shroud. While the core segment 224 is described as being external to the main housing 285, the core segment 224 of exemplary embodiments of the resonant transformers described herein can be disposed within the housing.

The size of the gap 275 can be varied between a minimum value and a maximum value such that one or more ranges of inductance values can be achieved using the resonant transformer 200. As one example, where both of the taps 252 and 262 of the coils 250 and 260, respectively, are used in parallel with a load, the size of the gap 275 can be controlled to operate the resonant transformer 200 within a first range of inductance values. As another example, when only one of the taps of one of the coils (e.g., tap 252 of coil 250) is used, the gap 275 can be controlled to operate the resonant transformer 200 within a second range of inductance values (e.g., twice the inductance values of the first range). As yet another example, where both of the coils 250 and 260 are used in series with a load, and the tap 262 is used as an output of the resonant transformer 200, the size of the gap 275 can be controlled to operate the resonant transformer 200 within a third range of inductance values (e.g., twice inductance values of the second range).

As a non-limiting example to illustrate an operation of exemplary embodiments of the resonant transformers described herein, the coils 250 and 260 can be electrically coupled in parallel and can include coil arrangements described herein having a specified number of turns to generate a voltage upwards of, for example, forty (40) kilovolts in response to an input voltage of about two thousand (2,000) to four thousand (4,000) kilovolts. The coil arrangement of the coils 250 and 260 to achieve this output voltage can create an inductance in the coil that allows the size of the gap to be relatively small when compared to conventional resonant transformers. For example, in some embodiments, when only the coils 250 is used the gap size can be varied from approximately one (1) millimeter to approximately fifty (50) millimeters to generate an inductance of approximately four hundred (400) Henries to approximately thirty (30) Henries, respectively, while some conventional resonant transformers generally require a maximum gap size of one-hundred fifty (150) millimeters to achieve the lower end of the inductance range. When the coils 250 and 260 are used in parallel, the same range for the size of the gap can be used to generate an inductance of approximately two hundred (200) Henries to approximately fifteen (15) Henries, while allowing the current rating of the resonant transformer to approximately double. When the coils 250 and 260 are used in series, the same range for the size of the gap can be used to generate an inductance of approximately eight hundred (800) Henries to approximately sixty (60) Henries.

In exemplary embodiments, the coil arrangement of the coils 250 and 260 can be configured as described herein with respect to FIGS. 5-8 to reduce and/or minimize undesirable discharge of the coils 250 and 260 such that exemplary embodiments of the present disclosure do not generally require that the interior of the main housing be filled with an insulating oil. In the present embodiment, the interior of the main housing 285 can be filled with a gas at atmospheric or moderate pressure. For example, the interior of the main housing 285 can be filled with air (e.g., atmosphere) or an inert gas (such as nitrogen). The main housing 285 can be sealed to maintain the gas 290 under a low to moderate pressure (e.g., ~0 to ~5 psig). The wall 202 can be formed from a non-conductive, non-magnetic material. For example, in some embodiments, the wall 202 can be formed from Plexiglas, fiberglass, acrylic, plastic or other polymers, carbon-based composite materials, and/or any other suitable materials.

Because the coil arrangements described herein allow the interior of the housing 285 to be filled with air or an inert gas, rather than an insulting oil, exemplary embodiments of the resonant transformers described herein can be lighter than conventional resonant transformers. The combination of the coil arrangement and the position of the core segment 224 external to the housing 285 provides for a smaller, lighter, efficient, and stable variable inductance resonant transformer. While the core segment 224 has been described as being external to the housing in some embodiments, those skilled in the art will recognize that the core segment 224 can be disposed within the housing 285 while still realizing some advantageous of exemplary embodiments of the present disclosure as compared to convention resonant transformer designs.

In some embodiments, the resonant transformer 200 can include a non-magnetic inflatable member 248 that can be positioned in the gap 275 between the terminal end 232 and the first end 242, such that the inflatable member 248 can be inflated to fill or at least partially fills the gap 275. The inflatable member 248 can provide mechanical stability to resonant transformer by filling the gap 275 to prevent or reduce undesirable movement of the core segment 224 with respect to the terminal end 232 of the core segment 222 due to, for example, vibrations or other mechanical shocks. While exemplary embodiments have been illustrated herein using inflatable members, exemplary embodiments of the present disclosure can use soil non-magnetic wedge-shaped members instead of or in addition to the inflatable members to provide stability to the resonant transformers by inserting the non-magnetic solid members into the space between the core segments.

In exemplary embodiments, an actuator 280 can be operatively coupled to the core segment 224 to move the core segment 224 about the joint 246. For example, as shown in FIG. 2, the actuator 280 can be operatively coupled to the first end 242 of the core segment 224 to control a distance (e.g., the gap 275) between the first end 242 and the terminal end 232; thereby controlling the inductance of the resonant transformer 200. In some embodiments, the actuator 280 can be a screw-type actuator in which a threaded shaft 282 operative coupled to the core segment 224 rotates to move the core segment towards or away from the core segment 222. The actuator 280 can be disposed inside or outside of the housing 285.

In some embodiments, the actuator 280 can be manually and/or programmatically controlled to adjust the inductance of the resonant transformer 200 to a specified value. As one example, in some embodiments, a control interface 286 including one or more controls (e.g., buttons, knobs, etc.) can be operatively coupled to the actuator to allow a user of the resonant transformed to control the actuator 280. As another example, in some embodiments, the processing device 220 can be operatively coupled to the actuator 280 and can be programmed and/or configured to automatically and/or programmatically control the actuator 280 to control an inductance of the resonant transformer 200 based on a distance between the first end 242 and the terminal end 232 in response to user inputs and/or in response to sensed and/or monitored parameters from which a desired inductance of the resonant transformer 200 can be derived.

Figure 3:
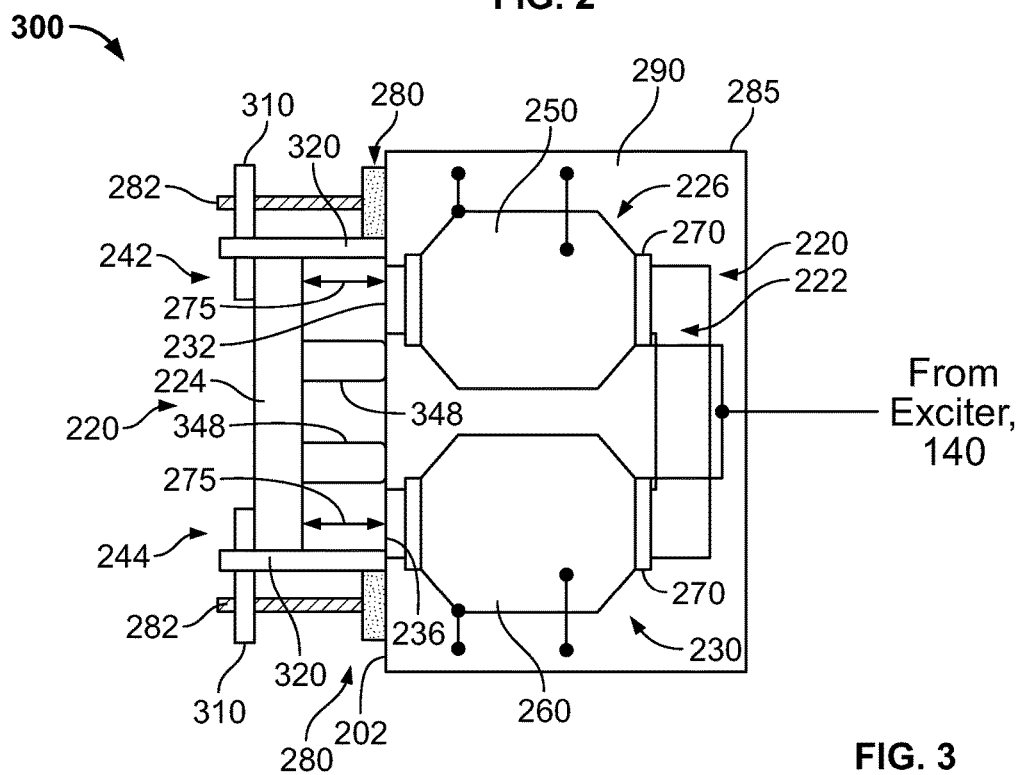

FIG. 3 is a schematic diagram of a resonant transformer 300 in accordance with exemplary embodiments of the present disclosure. The resonant transformer 300 can include embodiments of the magnetic core 220 formed by the core segment 222 and the core segment 224, the conductor coils or windings 250 and 260 disposed, wound, or wrapped over the core mandrel 270 disposed on the legs 226 and 230 and the main housing 285 within which the core segment 222, coils 250 and 260, and gas 290 are disposed, as described herein. The first and second ends 242 and 244 of the core segment 224 can be moved linearly and uniformly away or towards the core segment 222 to change a size of the gap 275. For example, a guide member 310 can be disposed at each of the first and second ends 242 and 244 of the core segment 224, and can be configured to engage a corresponding track 320 that is mounted to and extends substantially perpendicularly away from wall of the main housing 285. As actuators 280 manipulate threaded shafts 282 to translate the core segment 224, the guide member 310 at each of the first and second ends 242 and 244 slide along the corresponding track 320 so that the core segment 224 translates alone the tracks 320 and can be positioned to be in contact with the terminal ends 232 and 236 or spaced away from the terminal ends 232 and 236 to adjust the size of the gap 275, and therefore, the inductance of the resonant transformer 300.

In some embodiments, one or more non-magnetic inflatable members 348 can be inserted between the wall 202 and the core segment 224 to provide mechanical stability to the resonant transformer. In some embodiments, one or more resilient members (e.g., springs) can be operatively coupled between the core segment 224 and the wall 202. The resilient members can be biased to urge the core segment 224 towards the wall 202. In some embodiments, instead of, or in addition to, using threaded shafts 282, the inflatable members 348 can be controlled by actuators 280 to inflate the inflatable members 348 and urge the core segment 224 away from the core segment 222, overcoming the force applied by the resilient member to change the size of the gap, and therefore the inductance of the resonant transformer.

Figure 4:
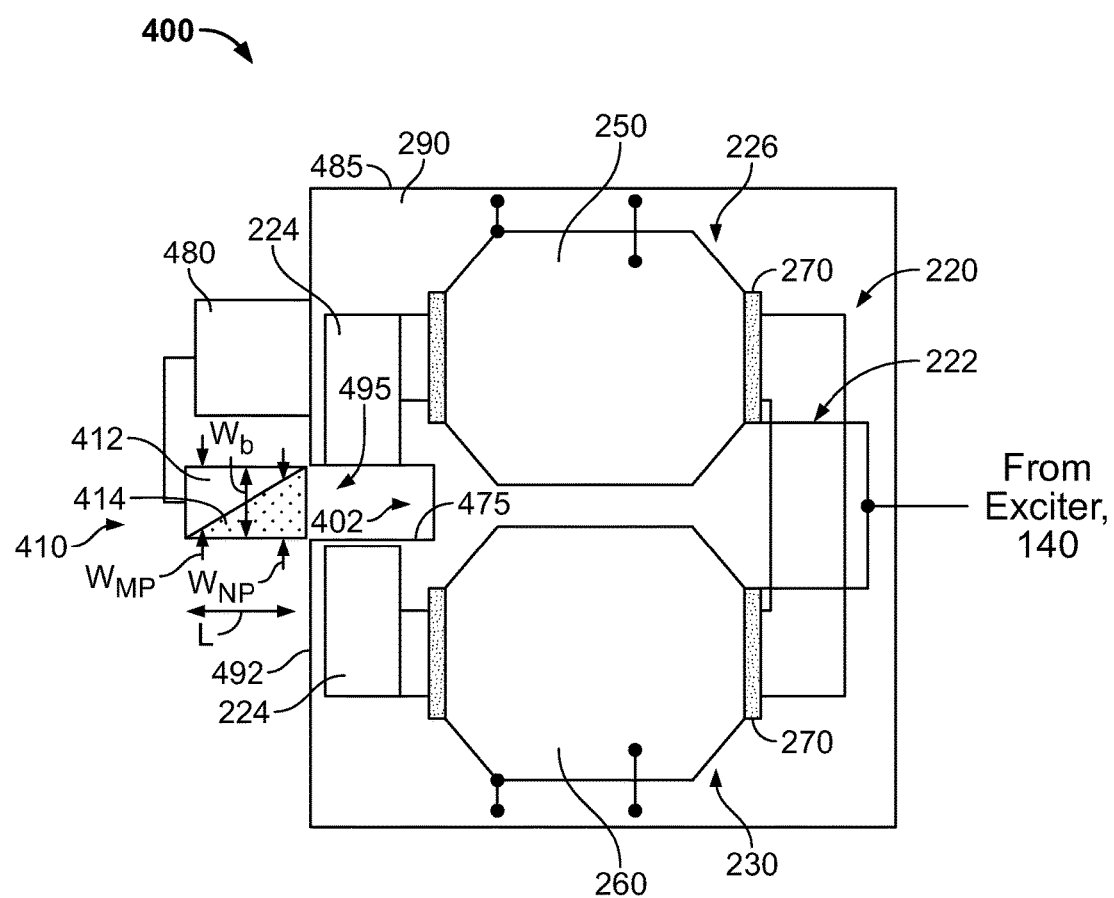

FIG. 4 is a schematic diagram of a resonant transformer 400 in accordance with exemplary embodiments of the present disclosure. The resonant transformer 400 can include embodiments of the magnetic core 220 formed by the core segment 222 and the core segment 224, the conductor coils or windings 250 and 260 disposed, wound, or wrapped over the core mandrels 270 disposed on the legs 226 and 230 of the core segment 222. As shown in FIG. 4, the core segments 222 and 224 of the core 220 can be permanently connected or integrally formed, and a slice of magnetic material that forms the core segment 224 can be removed from the core segment 224 to form a notch 495 in the core segment 224 that is devoid of magnetic material. The size of the notch 495 can correspond to a maximum size of a gap 402. The core segments 222 and 224 can be disposed in a housing 485, which can be filled with the gas 290 and a recess 475 can be formed in a wall 492 of the housing 485 and can extend into the notch 495. The recess 475 in the housing can coincide with the notch 495 and can have a width $W_N$. The recess 475 can be configured to receive the plunger insert 410. The dimensions of the plunger insert 410 can correspond the recess 475 such that the plunger insert 410 fits completely and tightly or snugly within the recess 475 to fill the notch 495. To achieve a variable inductance, plunger insert 410 can be inserted and/or removed from the recess 475. An actuator 480 can be operatively coupled to the plunger insert 410 to control a movement of the plunger insert 410.

The plunger insert 410 can be formed by a tapered or wedge-shaped magnetic portion 412 composed of a magnetic material and a tapered or wedge shaped non-magnetic portion 414 composed of a non-magnetic material. As shown in FIG. 4, the plunger insert 410 can have a rectangular body that extends along a longitudinal axis L of the plunger insert 410. The body can have a width $W_b$ measured perpendicularly to the longitudinal axis L, the portion 412 can have a width $W_{MP}$, and the portion 414 can have a width $W_{NP}$. The width $W_b$ of the body can be slightly smaller than the width $W_N$. The mathematical sum of the width $W_{MP}$, and the width $W_{NP}$ at any point along longitudinal axis L of the body can equal the width $W_b$ of the body at such point. In exemplary embodiments, at a first end of the body, the width $W_{MP}$ of magnetic portion can be approximately equal to the width $W_b$ of the body, and at a second end of the body, the width $W_{MP}$ of magnetic portion can be approximately zero. At the first end of the body, the width $W_{NP}$ of non-magnetic portion can be approximately zero, and at the second end of the body, the width $W_{NP}$ of magnetic portion can be approximately equal to the width W of the body. In some embodiments, the width $W_{MP}$ of magnetic portion can decrease linearly from the first end to the second end, and the width $W_{NP}$ of non-magnetic portion can increase linearly from the first end to the second end. In some embodiments, the width $W_{MP}$ of magnetic portion and the width $W_{NP}$ of non-magnetic portion can change non-linearly along the longitudinal axis L.

The actuator 480 can be operatively coupled to the plunger insert 410 to move the plunger insert 410 into and out of the recess 475 to adjust the size of the gap 402, and therefore, the inductance of the resonant transformer 400. For example, the plunger insert 410 can be controlled by the actuator 480 to position the plunger insert 410 so that the magnetic portion 412 is disposed in the notch 495. The width $W_{MP}$ of the magnetic portion 412 of the plunger insert 410 can determine the inductance of the resonant transformer 400. As one example, when the width $W_{MP}$ of the magnetic portion 412 that is substantially equal to the width $W_b$ of the body is disposed in the notch, the size of the gap 402 can be reduced by the width $W_{MP}$ of the magnetic portion 412 disposed in the recess 475 and the inductance of the resonant transformer will be at its maximum value. As another example, when the magnetic portion 412 of the inert 410 is removed from the recess 475, the size of gap 402 can be at its maximum and the inductance of the resonant transformer will be at its minimum value. Thus, the width $W_{MP}$ the magnetic portion 412 can be used to change a width of the gap 402 to change the inductance of the resonant transformer 400.

Figure 5:
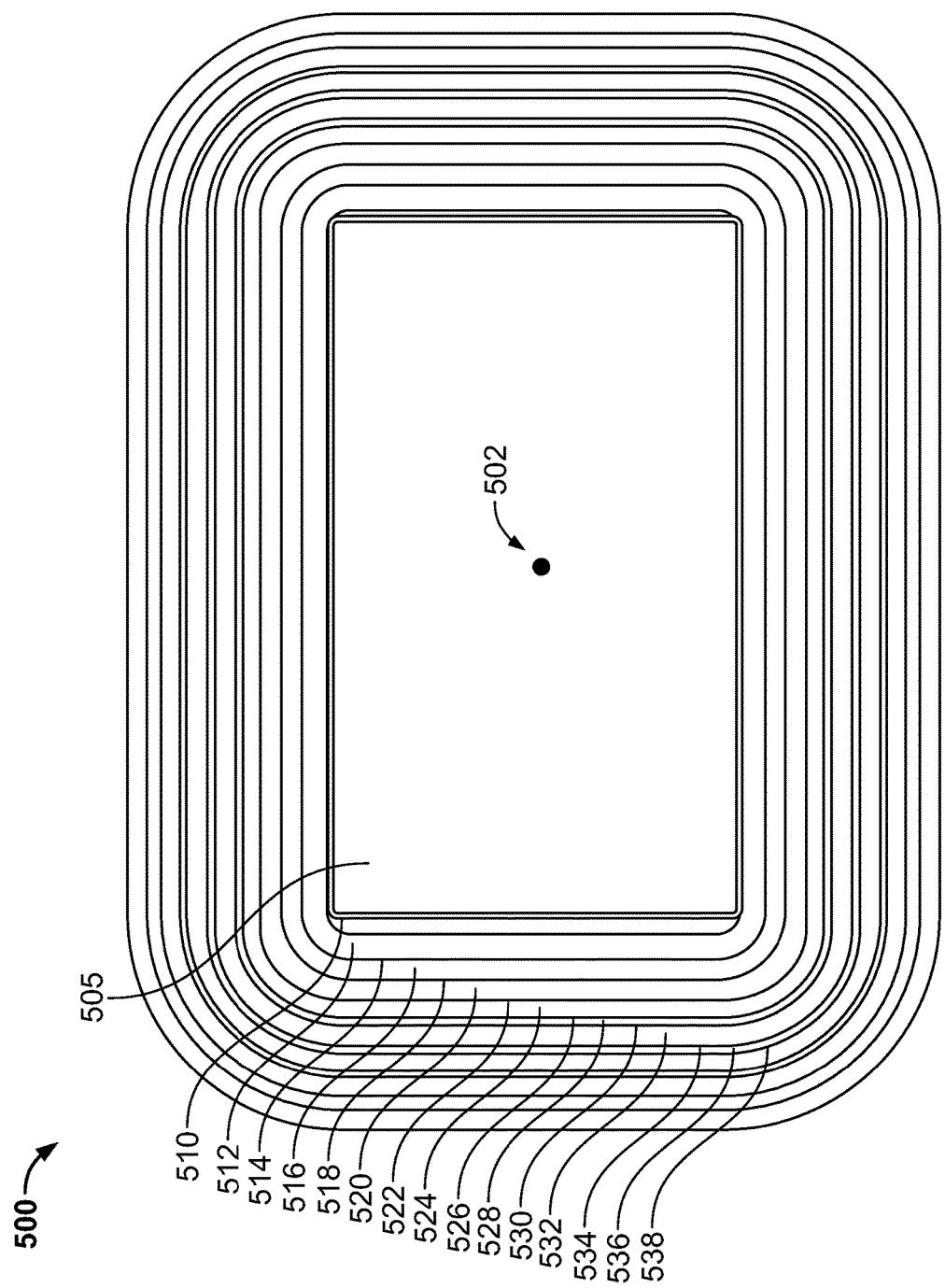
FIG. 5 depicts a cross-section of an exemplary portion of a coil arrangement taken transverse to a central axis of the coil arrangement in accordance with exemplary embodiments of the present disclosure.
Figure 6:
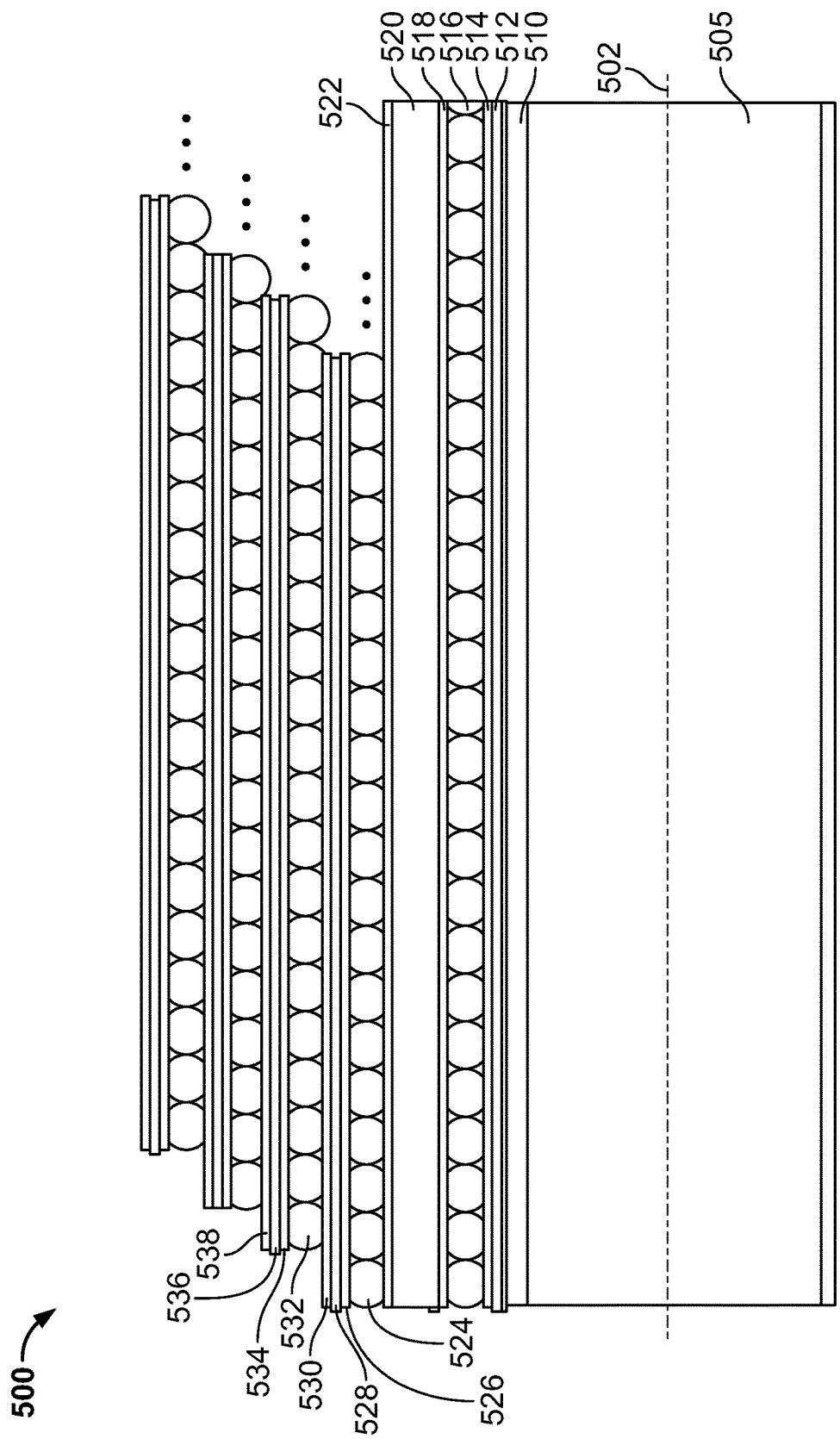
FIG. 6 depicts a cross-section of an exemplary portion of a coil arrangement taken along a central axis of the coil arrangement in accordance with exemplary embodiments of the present disclosure.

FIGS. 5-8 depict a coil arrangement 500 of a resonant transformer and portions thereof in accordance with exemplary embodiments of the present disclosure. For example, exemplary embodiments of the coil arrangement 500 can be used for embodiments of the conductor coils or windings 250 and/or 260 disposed, wound, or wrapped about portions (e.g., legs) of the core segment 222, as described herein. FIG. 5 depicts an exemplary cross-section of an exemplary portion of the coil arrangement 500 taken transverse to a central axis 502 of the coil arrangement 500. FIG. 6 depicts an exemplary cross-section of an exemplary portion of the coil arrangement 500 taken along the central axis 502 of the coil arrangement 500.

Referring to FIGS. 5 and 6, the coil arrangement 500 can be coaxially and concentrically wrapped or wound over a non-metallic core mandrel 510 that surrounds a magnetic core segment 505. The coil arrangement 500 can include coaxially and concentrically arranged layers of pressure tape, compressible insulating material, and conductive wire wound in successive layers over the core mandrel 510 in a generally repetitive pattern. In some embodiments, the pressure tape can be formed from Mylar and the compressible insulating material can be high voltage ethylene-propylene rubber (EPR). In some embodiments, a (first) layer 512 of an insulating material can substantially cover an outer surface of the core mandrel 510, and a (first) layer 514 of pressure tape can be disposed coaxially and concentrically over the (first) layer 512 of the insulating material.

A course 516 of grounding wire can be coaxially and concentrically wrapped or wound around the (first) layer 514 of the pressure tape along the portion of the length of the core mandrel 510 to form a coil having a generally helically shape and a specified number of total turns. The pressure tape generally prevents the turns of coils from individually indenting the insulating material such that coils uniformly compress the insulating material. In some embodiments, the grounding wire can be wrapped directly on the core mandrel 510. The course 516 of grounding wire can form a grounding coil of the coil arrangement 500 and can be wrapped or wound such that the grounding coil provides a net-zero induced voltage measured between a first end of the course 516 and a second end of the course 516. A first end of the grounding wire can be operatively coupled to ground at the first end of the mandrel and a second end of the grounding wire can be a free or "floating" end (e.g., not directly or indirectly electrically coupled to ground or another voltage potential).

Still referring to FIGS. 5 and 6, a (second) layer 518 of the pressure tape can be disposed over the course 516 of grounding wire to substantially cover the course 516 of the grounding wire, and a (second) layer 520 of the compressible insulating material can be disposed over the (second) layer 518 of the pressure tape to substantially cover the (second) layer 518 of the pressure tape. A (third) layer 522 of the pressure tape can be disposed over the (second) layer 520 of the compressible insulating material to substantially cover the (second) layer 520 of the compressible insulating material. In some embodiments, the layers 512, 514, 516, 518, 520, and 522 can be referred to as the grounding coil layer of the core arrangement 500.

The layers that are added to the core arrangement 500 after (or including) the (third) layer 522 of the pressure tape can form a repetitive pattern. Although two iterations of the repetitive pattern are described with respect in FIGS. 5 and 6, exemplary embodiments of the present disclosure can include more or fewer iterations of the repetitive pattern. For example, the pattern can be repeated, as necessary, to achieve a specified or desired inductance or output voltage with the resonant transformer. A first iteration of the repetitive pattern can include a (first) course 524 of step-up wire that can be coaxially and concentrically wrapped or wound around the (third) layer 522 of the pressure tape along the portion of the length of the core mandrel 510 to form a coil having a generally helically shape and a specified number of total turns. The pressure tape generally prevents the turns of coils from individually indenting the insulating material such that coils uniformly compress the insulating material. A first end of the (first) course 524 of coil can be connected to an input node of the resonant transformer or to an output of another coil in the resonant transformer. The (first) course 524 of step-up wire can form a voltage step-up coil of the coil arrangement 500 and can be wrapped or wound such that a non-zero voltage can be generated in the step-up coil (e.g., at a second end or anywhere along the length of the step-up coil) in response to an input voltage received at a first end of the step-up wire.

A (fourth) layer 526 of the pressure tape can be disposed over the (first) course 524 of the step-up wire to substantially cover the (first) course 524 of the step-up wire, and a (third) layer 528 of the compressible insulating material can be disposed over the (fourth) layer 526 of the pressure tape to substantially cover the (fourth) layer 526 of the pressure tape. A (fifth) layer 530 of the pressure tape can be disposed over the (third) layer 528 of the compressible insulating material to substantially cover the (third) layer 528 of the compressible insulating material. In some embodiments, the layers 524, 526, 528, and 530 can be referred to as a (first) step-up coil layer of the core arrangement 500.

To illustrate the repetitive pattern, a second iteration of the repetitive pattern is shown to include a (second) course 532 of the step-up wire that can be coaxially and concentrically wrapped or wound around the (fifth) layer 530 of the pressure tape along the portion of the length of the core mandrel 510 to form a coil having a generally helically shape and a specified number of total turns that is less than the number of turns of the preceding step-up coil. The (second) course 532 of wire is a continuation of the step-up wire used to form preceding step-up coil (or is electrically coupled to an end of the step-up wire used to form the preceding step-up coil). The pressure tape generally prevents the turns of coils from individually indenting the insulating material such that coils uniformly compress the insulating material. The (second) course 532 of wire can form another voltage step-up coil of the coil arrangement 500.

A (sixth) layer 534 of the pressure tape can be disposed over the (second) course 532 of the wire to substantially cover the (second) course 532 of the wire, and a (fourth) layer 536 of the compressible insulating material can be disposed over the (sixth) layer 534 of the pressure tape to substantially cover the (sixth) layer 534 of the pressure tape. A (seventh) layer 538 of the pressure tape can be disposed over the (fourth) layer 536 of the compressible insulating material to substantially cover the (fourth) layer 536 of the compressible insulating material. In some embodiments, the layers 532, 534, 536, and 538 can be referred to as a (second) step-up coil layer of the core arrangement 500.

As shown in FIGS. 5 and 6, each step-up coil layer in the coil arrangement 500 can be formed sequentially by coaxially and concentrically wrapping or winding a course of step-up wire around a previous coil layer (e.g., a previous step-up coil layer or a grounding coil layer) along at least a portion of a length of the core mandrel 510. The coil in the grounding coil layer can be wrapped or wound about at least a portion of the length of the core mandrel 510 such that there are no coil layers between the grounding coil layer and the core mandrel 510. In exemplary embodiments, the coil layers of the core arrangement 500 (e.g., step-up coil layers and a grounding coil layer) and the core mandrel 510, can each be generally disposed coaxially and concentrically with respect to each other.

A quantity of step-up coil layers in the coil arrangement 500 can determine an output voltage that is output by a resonant transformer (e.g., embodiments of the transformers described herein) in response to an input voltage. In exemplary embodiments, each successive/consecutive step-up coil layer can include fewer turns than the preceding step-up coil layer to form a stepped or graded geometry of step-up coil layers having an generally sloping profile at the ends of the coil arrangement 500, as shown in FIG. 6. A total number of cumulative turns in the step-up coil layers can be specified to achieve a desired output voltage in response to a specified input voltage. The stepped or graded structure of the coil arrangement can provide electrical stability to the coil arrangement to reduce or mitigate undesirable discharges for the coil arrangement during use. In exemplary embodiments, the quantity of step-up coil layers can be selected for generating a high voltage (e.g., the quantity of step-up coil layers can be selected to generate hundreds of volts, kilovolts, tens of kilovolts, hundreds of kilovolts) in response to a moderate input voltage (e.g., kilovolts). As a non-limiting example, in some embodiments, the coil arrangement 500 can be configured to receive an input voltage of approximately zero (0) to approximately two (2) kilovolts, and can be configured to output approximately zero (0) to forty (40) kilovolts.

Figure 7:
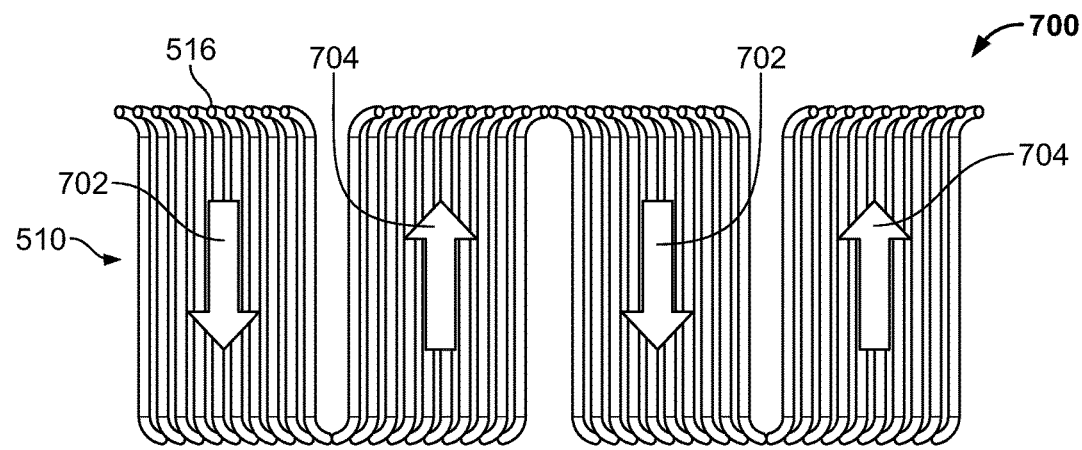
FIG. 7 is a schematic diagram of an exemplary winding of wire to form a grounding coil for a coil arrangement in accordance with exemplary embodiments of the present disclosure.

FIG. 7 is a schematic diagram of an exemplary winding of the course 516 of the grounding wire to form a grounding coil 700 for the coil arrangement 500. The course 516 of wire can be wrapped or wound about the core mandrel to achieve a net-zero induced voltage measured between the first end and the second end of the grounding coil 700 formed by the course 516 of grounding wire. To achieve the net-zero induced voltage, the grounding wire is wound such that a total number of turns of the grounding coil in the clockwise direction along the length of the core mandrel 510 is equal to or substantially equal to a total number of turns in the counter clockwise direction along the length of the core mandrel for the course 516 of grounding wire. For example, half of the turns for the course 516 of grounding wire (i.e., forming the grounding coil) can be in the clockwise direction and half of the turns for the course 516 of grounding wire can be in the counter clockwise direction.

To reduce voltage build-up within the grounding coil, a direction in which the course 516 of grounding wire is wrapped or wound can alternate (e.g., between clockwise and counterclockwise directions about the core mandrel). For example, in exemplary embodiments, the course 516 of wire (i.e. the grounding coil) can be wrapped or wound so that the wire alternates between a specified number of turns about the core mandrel 510 in a first generally circumferential direction along a length of the core mandrel 510 as shown by arrow 702 (e.g. a specified number of turns in a clockwise direction) and a specified number of turns about the core mandrel 510 in a second circumferential direction along a length of the core mandrel as shown by arrow 704 (e.g. a specified number of turns in a counter clockwise direction). As shown in FIG. 7, for example, the course 516 of grounding wire can be wrapped and wound about the core mandrel 510 to alternate between the same number of turns in the clockwise and counterclockwise directions (e.g., alternating between ten turns in the clockwise direction and ten turns in the counter clockwise direction). While FIG. 7 illustrates a non-limiting example of a pattern of alternating turns that form the grounding coil, exemplary embodiments of the present disclosure can be implemented using other patterns of alternating turns so that the wire is wound to form a grounding coil that has an equal or substantially equal number of turns in the clockwise direction along the length of the core mandrel 510 and in the counter clockwise direction along the length of the core mandrel 510 for the (first) course 516 of the grounding wire.

Figure 8:
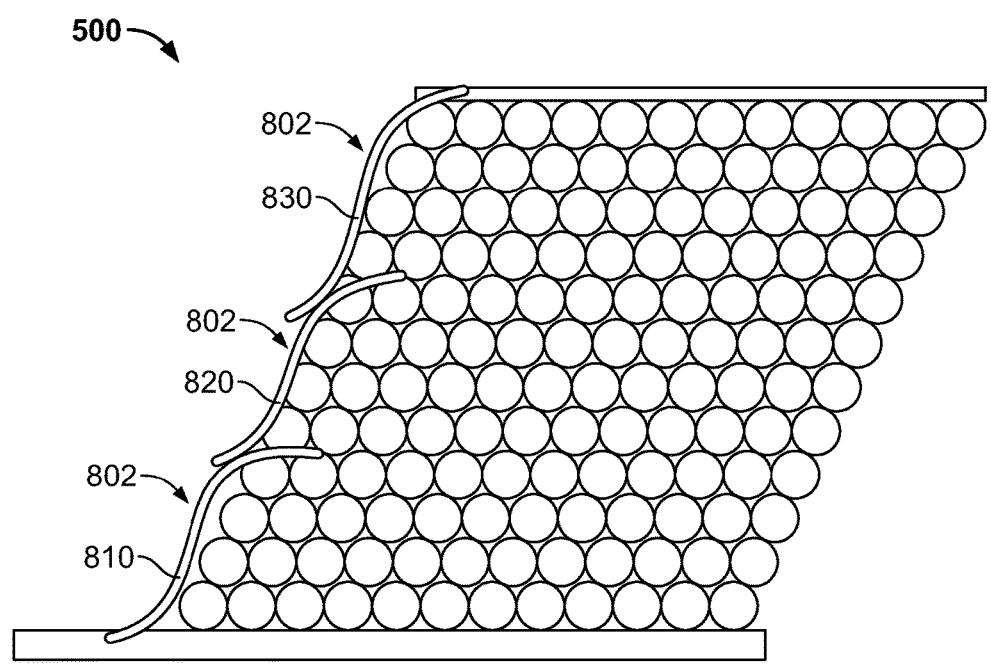
FIG. 8 is a schematic diagram of an exemplary electrical stress control arrangement for a coil arrangement in accordance with exemplary embodiments of the present disclosure.

FIG. 8 shows an electrical stress control arrangement that can be implemented for the coil arrangement 500. As shown in FIG. 8, grading tape 802 can be disposed along the sloped profile of the stepped or graded ends of the coil arrangement 500 to limit the electrical stress on the coil arrangement 500 at the ends of the coil arrangement 500. The grading tape 802 can be inserted between step-up coil layers and can extend generally towards the core mandrel 510. As the grading tape 802 approaches the core mandrel 510, the grading tape can be bent to transition from a generally radial direction to a generally longitudinal direction with respect to the core mandrel. The grading tape 802 can be disposed with respect to the core mandrel 510 such that the grading tape 802 is in proximity to, but does not come in contact with the ground coil (e.g., is spaced away from the ground coil by, for example, approximately one centimeter). The grading tape 802 can be formed of a non-linear dielectric material that limits the electrical stress at the ends of the coil arrangement 500 to prevent or reduce undesirable electrical discharges or breakdowns at the ends of the coil arrangement 500. For example, in some embodiments, the grading tape 802 can be formed by a polymer base, such as EPR rubber, with ferroelectric or metal oxide powdered materials to impart dielectric non-linearity to the grading tape 802.

In exemplary embodiments, pieces of the grading tape 802 can be layered and stacked radially from the grounding coil to an outer step-up coil layer. For example, a first piece of grading tape 810 can extend from proximate to grounding coil up to a specified number of step-up coils. A second piece of pressure tape 820 can begin at and overlap the end of the first piece of grading tape 810 and can extend up to a specified number step-up coil layers. A third piece of grading tape 830 can begin at and overlap the end of the second piece of grading tape 810 and can extend up to a specified number step-up coil layers. In general, the grading tape 802 is disposed to cover the edge of the coil arrangement 500 and extend to be proximate to the grounding coil to limit or relieve electrical stress that may build up at the ends of the coil arrangement 500.

Embodiments of the coil arrangement 500 described with respect to FIGS. 5-8 can advantageously reduce the likelihood of undesirable electrical discharges due to the configuration of the grounding coil layer, the pressure tape layers, the insulating material layers, the use of fewer turns on successive layers of step-up coil to create a sloped profile, and/or the use of the grading tape along the ends of the coil arrangement. The reduction of the likelihood of undesirable electrical discharge advantageously allows exemplary embodiments of the resonant transformers that utilize the coil arrangement 500 to operate safely and effectively without require the coil arrangement for be immersed in an insulating oil. As a result, exemplary embodiments of the present disclosure can include resonant transformers that are lighter than conventional resonant transformers. The reduced likelihood of undesirable electrical discharges also allows the coil arrangement 500 to include more turns than coils in convention resonant transformers, which allows exemplary embodiments of the resonant transformers to have higher inductances and higher output voltages than convention resonant transformers. By creating coils according the embodiments of the coil arrangement 500 with higher inductances than conventional coil arrangements, the size of gap in exemplary embodiments of resonant transformers described herein can be smaller than conventional resonant transformers, while allowing for a wide range of inductances suitable for achieving resonance with a wide range of load capacitances.

Exemplary embodiments of the present disclosure advantageously provide a relatively small and light resonant transformer that can be controlled to provide an accurate and stable inductance value. For example, embodiments of the coil arrangement described herein can reduce undesirable electrical discharges to provide a stable resonant transformer that can operate without being enclosed in a housing that is maintained under high pressure or filled with oil as are conventional high voltage resonant transformers. Unlike conventional resonant transformers, which use cellulose and an insulating oil to maintain dielectric stability, the (dielectric) stability provided by embodiments of the coil arrangement, allows the housing of exemplary embodiments of the resonant transformer (when used) to be filled with lighter materials, such as air at low humidity (dry air) or inert gases (e.g., nitrogen) at relatively low pressure (0-5 psig). Additionally, by disposing a portion of the split magnetic core external to the main housing, the main housing can be made smaller than tanks of conventional transformers, which advantageously provide for a further reduction in size and weight as compared to convention resonant transformers. Experimental data indicates that exemplary embodiments of the resonant transformer can have a total weight (including power supply and controls) that is less than approximately thirty-five percent (35%) to approximately sixty-five percent (65%) of the weight of an equivalent conventional resonant transformer. For example, an exemplary embodiment of the resonant transformer including two coils can weigh approximately 1,100 to approximately 1,200 pounds, while a conventional resonant transformer can weigh over 3,000 pounds. A reduction in size and weight of the resonant transformer can allow exemplary embodiments of the resonant transformer to be housed inside a small van rather than a medium size truck.

When the air gap is set to a minimum value, exemplary embodiments of the resonant transformers described herein can generate an inductance that has a value that significantly higher than conventional resonant transformers; allowing resonance to be achieved with very short cables. For example, due to the dielectric stability of the coil arrangements described herein, the coils of the resonant transformers can include a number of turns to generate a large enough inductance to form a resonant circuit with a load capacitance of ten (10) to twenty (20) nanofarads when the gap of the resonant transformer is set to the minimum gap size and the output frequency is set between approximately fifty (50) hertz and approximately sixty (60) hertz. Such inductances are typically not achieved at power frequencies of 50 Hz to 60 Hz in commercially available conventional resonant transformers.

Similarly, the gaps of exemplary embodiments of the resonant transformers of the present disclosure can advantageously be smaller than that in a conventional resonant transformer and can be configured in such a manner that the air gap can be placed either outside or inside the main housing. Because the coil arrangements described herein can generate a suitably large inductance while maintaining dielectric stability, the size of the gaps can be reduced as compared to conventional resonant transformers, while still achieve a wide range of inductances to allow the resonant transformer to be configured to achieve resonance with small load capacitances (e.g., 10 nanofarads) and large load capacitances (e.g., 800 nanofarads). The size of the gap can be changed step-wise or continuously with the possibility of inserting a non-magnetic spacer between the faces of a split magnetic core and by exerting a compressive force on the inserts, to obtain a reactor inductance falling very close to that required to achieve resonance with the capacitance of the test cable. Final resonance can be achieved by changing a frequency of an input voltage to the resonant transformer between, for example, approximately 50 Hz and approximately 60 Hz.

Figure 9:
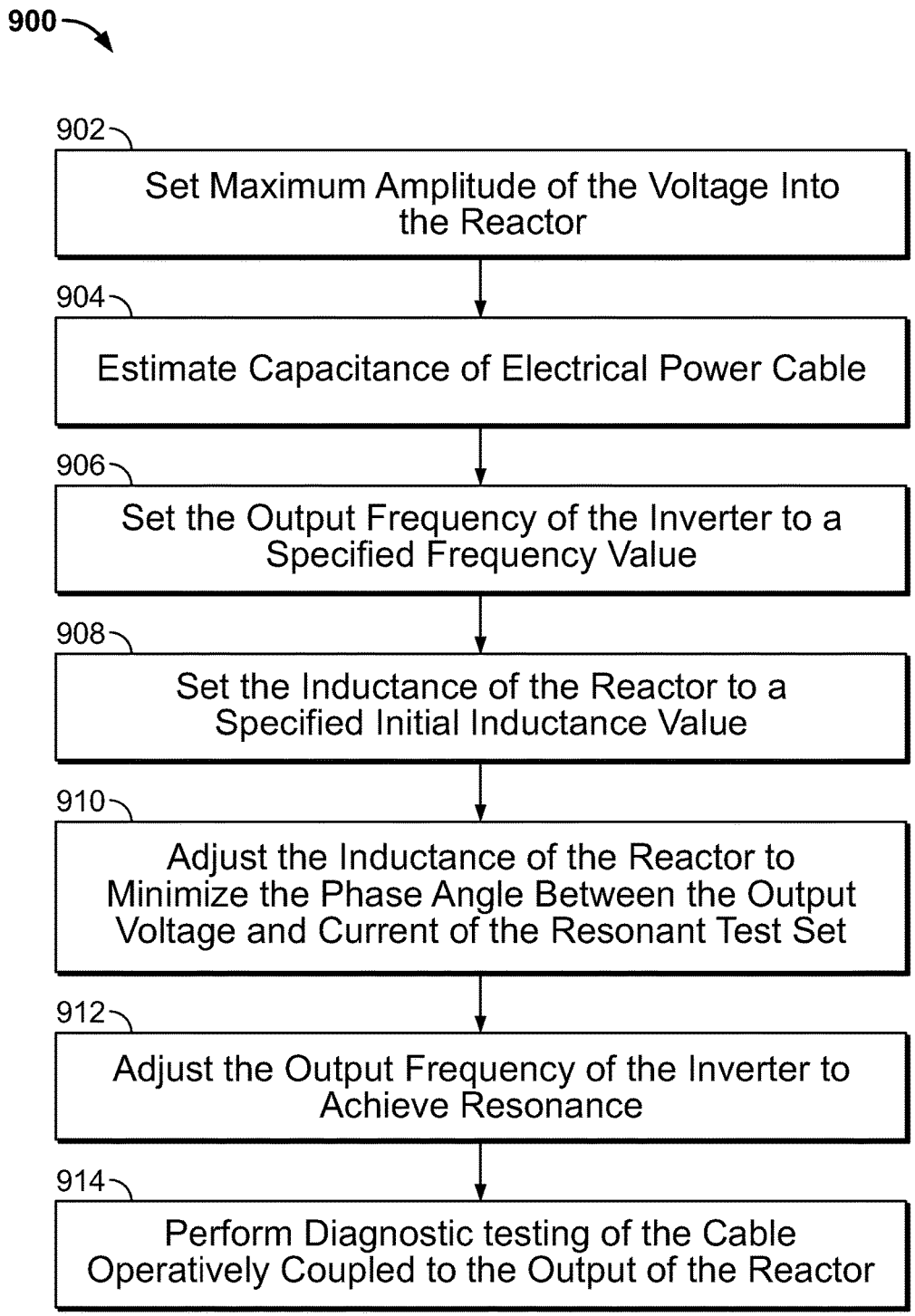
FIG. 9 is a flowchart of a process for configuring an example resonant test system to operate at or near resonance in accordance with exemplary embodiments of the present disclosure.

FIG. 9 is a flowchart of a process 900 for configuring exemplary embodiments of the resonant test set 104 to operate at or near resonance. To begin, at step 902, a maximum amplitude of a voltage of a resonant test signal at the input of the reactor can be set. The maximum amplitude can be specified based on the type of electrical power cable to be tested, which can be input by a user via the computing device of the resonant test system or can otherwise be obtained by the computing device. The resonant test system can monitor the amplitude of the voltage at the input of the reactor using voltage feedback to ensure that the amplitude does not exceed the specified maximum amplitude. At step 904 a capacitance of a cable for which diagnostic testing will be performed is determined. As described herein, in some embodiments, the capacitance of the cable can be estimated based on information about the cable, such as a length of cable, a conductor diameter of the cable, an insulation type of the cable, and a voltage class of the cable, which can be input by a user (e.g., via a graphical user interface rendered on a display by the computing device 106). In some embodiments, the user may input the estimated capacitance of the cable. In some embodiments, embodiments of the resonant test set 104 can be configured to estimate the capacitance of the cable based on preliminary testing of the cable.

Once the capacitance of the cable has been estimated, the process 900 can continue, to set the output frequency of the inverter to a specified frequency value, at step 906, and to set the inductance of the reactor to a specified initial inductance value, at step 908. For example, in exemplary embodiments the output frequency can be set to be at a midpoint of the power frequency (e.g., 55 Hz). The specified initial inductance value can be determine by controlling the gap between a split magnetic core of the reactor as described herein (e.g., by setting the size of the gap to a specified value).

At step 910, the controller can adjust the inductance of the reactor to minimize the phase angle between the output voltage and current of the resonant test set. For example, in exemplary embodiments, the size of the gap between the split core (e.g., the distance between split core segments) can be adjusted to adjust the inductance of the reactor until a phase angle value that is as close to zero as possible is achieved, where a phase angle of zero generally corresponds to resonance. In some embodiments, the size of the gap can be continuously or discretely changed, and as the size of the gap is changed, the absolute value of the phase angle can change (e.g., increase or decrease). The controller can identify the gap size that corresponds to the minimum phase angle and can set the gap size the identified gap size. Depending on the capacitance of the cable being tested, the gap of the split magnetic core of the reactor may be set such that resonance is achieved at the initial output frequency of the inverter. However, for many cables, the size of the gap can adjusted to set an inductance of the reactor that approaches or approximates resonance.

At step 912, with the inductance of the reactor set, the controller can adjust the output frequency of the inverter (if necessary) to achieve resonance. For example, the controller can sweep the output frequency of the inverter until the controller identifies an output frequency for which resonance is achieved. For example, in some embodiments, the output frequency of the inverter can be swept until a maximum output voltage and minimum output current is achieved. For embodiments in which the output frequency is initially set to 55 Hz, the output frequency can be decreased and/or increased incrementally until resonance is achieved. In some embodiments, the output frequency can be controlled at increments of 0.05, 0.1, 0.2, 0.3, 0.4, 05 Hz, and/or at any suitable frequency increment. Once resonance has been achieved, the resonant test set can be utilized, at step 914, to perform diagnostic testing of the cable operatively coupled to the output of the reactor. For example, in exemplary embodiments, a partial discharge test can implemented to identify whether the cable is experiencing partial discharges and/or where along the length of the cable the partial discharges are occurring.

Figure 10:
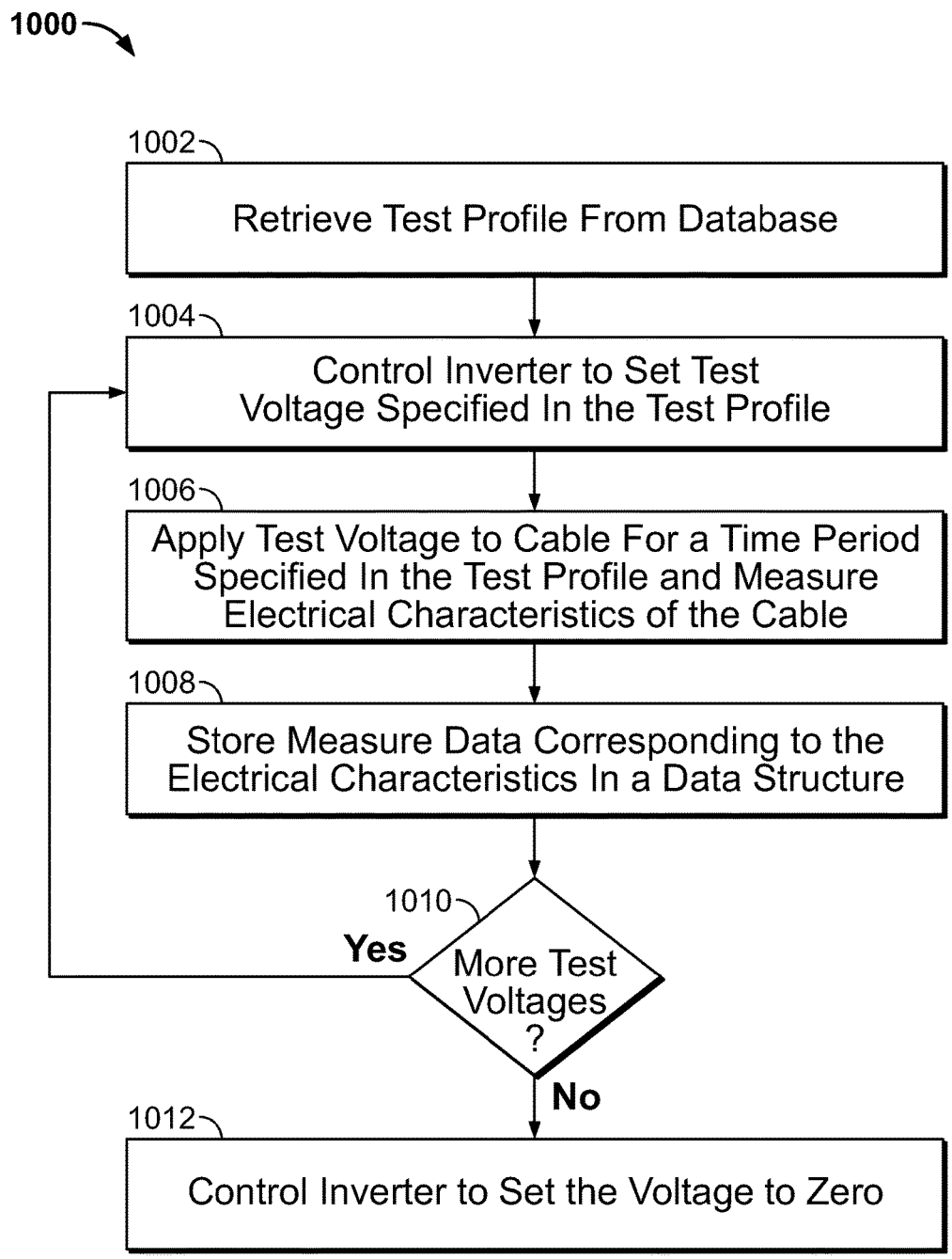
FIG. 10 is a flowchart illustrating an exemplary process of operating an embodiment of the resonant test system to implement a test profile.

FIG. 10 is a flowchart illustrating an exemplary process 1000 of operating an embodiment of the resonant test system 100 to implement a test profile. At step 1002, the computing device can execute code to retrieve a selected test profile from a database storing test profiles for different types of electrical cables. In exemplary embodiments, the user can be prompted to select a test profile via a graphical user interface generated by the diagnostic testing application or the test profile can be automatically selected by the application in response to information received via the graphical user interface describing and/or identifying the type of electrical cable to be tested. In response to an activation of a diagnostic test (e.g., upon selection of a button in the graphical user interface to initiate testing), the computing device can communicate with the processing device of the resonant test set to configure the frequency and inductance of the resonant test set based on a capacitance of the electrical cable to be tested as described herein and to set the output voltage of the resonant test set to a test voltage specified in the test profile, at step 1004. To set the output voltage of the resonant test set to the test voltage, the processing device can execute the firmware to control the inverter of the resonant test set to set the output voltage of the inverter. The output voltage of the inverter and the resonant test set can be monitored via feedback paths as described herein to ensure that the output of the resonant test set is within a specified tolerance of the test voltage.

At step 1006, the resonant test set can apply the test voltage to the cable being tested for a time period specified in the test profile and can measure electrical characteristics of the cable. The measured electrical characteristics can be transmitted from the resonant test set to the computing device to store data corresponding to the electrical characteristics of the cable in a data structure maintained by the computing device, at step 1008. After the test is complete, the data structure that stores the data corresponding to the electrical characteristics of the cable can be transmitted from the computing device to a remote server for further processing. At step 1010, the processing device of the resonant test set and/or the computing device can determine whether the test profile includes additional test voltages. If so, the process 1000 repeats from step 1004. Otherwise, the process 1000 continues at step 1012 to set the output voltage of the resonant test set to zero to complete the diagnostic test.

Figure 11:
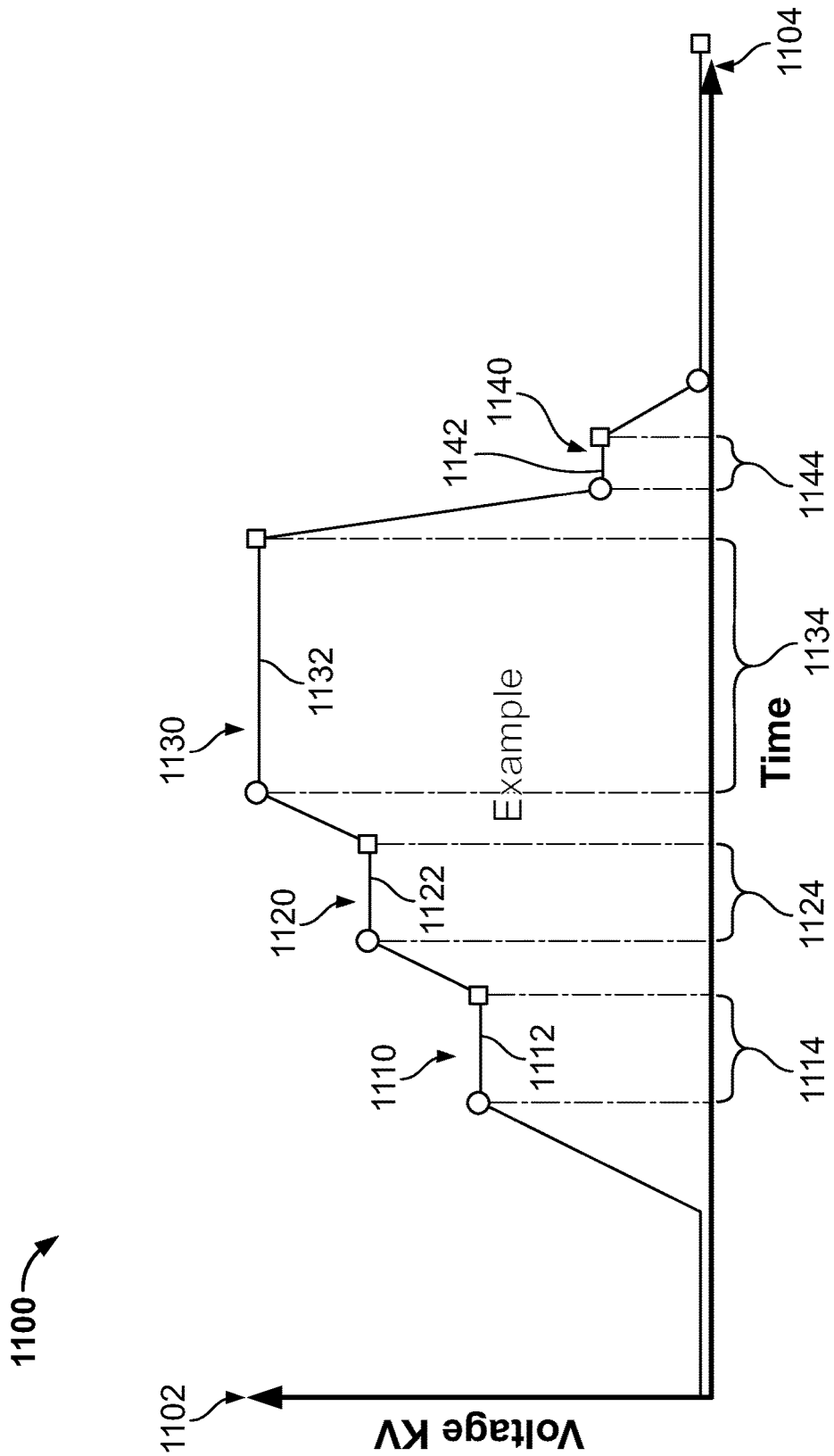
FIG. 11 is a graphical representation of an exemplary test profile 1100 that can be implemented by exemplary embodiments of the present disclosure.

FIG. 11 is a graphical representation of an exemplary test profile 1100 that can be implemented by exemplary embodiments of the present disclosure. A y-axis 1102 represents an output voltage from the resonant test set and a x-axis represents time. Initially, at time equal zero, the output voltage of the resonant test set is zero voltages. Once a diagnostic test is implemented the output voltage transitions from zero voltage to a test voltage 1112 and a test phase 1110 of the test profile 1100 beings. The test voltage 1112 remains constant for a time period 1114 and electrical characteristics of the electrical cable being tested are measured during the time period. When the time period 1114 expires, the resonant test set automatically transitions to a test voltage 1122 to begin a test phase 1120, during which the test voltage 1122 is held constant for a time period 1124. Electrical characteristics of the cable being tested are measured during the test phase 1120. When the time period 1124 expires, the resonant test set automatically transitions to a test voltage 1132 to begin a test phase 1130, during which the test voltage 1132 is held constant for a time period 1134. Electrical characteristics of the cable being tested are measured during the test phase 1130. At the expiration of the time period 1134, the resonant test set can automatically transition to a final test phase 1140 having a test voltage 1142, which is held constant for a time period 1144. Electrical characteristics of the cable being tested are measured during the test phase 1140. At the end of the test phase 1140, the output voltage of the resonant test can automatically return to zero volts to complete the test.

Figure 12:
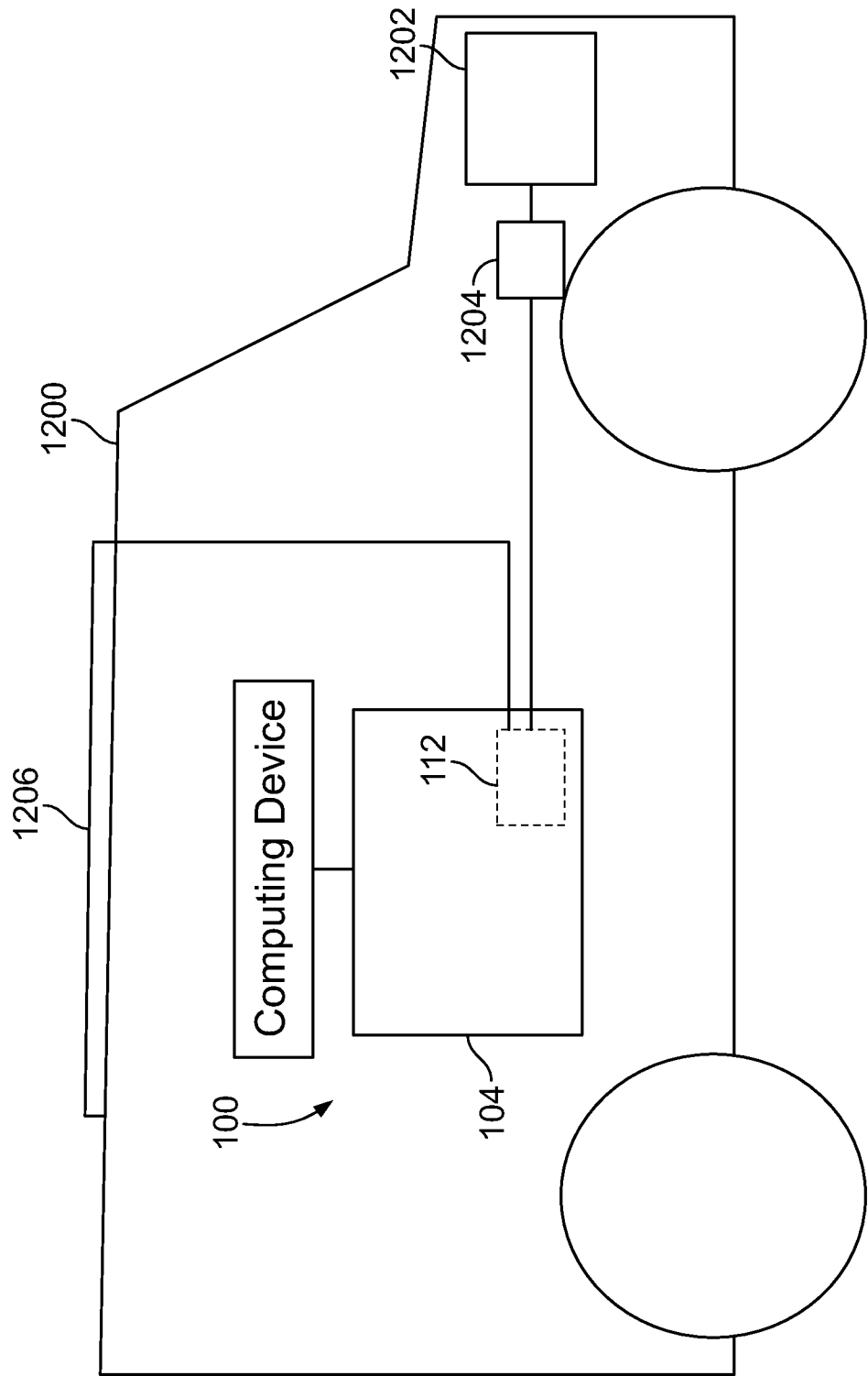
FIG. 12 is a schematic diagram illustrating an embodiment of a resonant test system disposed within a field vehicle to facilitate field testing of electrical power cables in accordance with exemplary embodiments of the present disclosure.

FIG. 12 is a schematic diagram illustrating an embodiment of the resonant test system 100 disposed within a field vehicle 1200 to facilitate field testing of electrical power cables. As shown in FIG. 12, the resonant test system 100 can be disposed with the field vehicle 1200. The vehicle 1200 can include an internal combustion engine 1202 that can be operatively coupled to the rechargeable power source 112 of the resonant test set 104. When the engine 1202 is operatively coupled to the rechargeable power source of the resonant test system 100 via an alternator 1204, and the engine 1202 is operating, the engine 1202 can charge the rechargeable power source through the alternator 1204. In some embodiments, the vehicle 1200 can include an array of solar cells 1206 disposed on or embedded in a roof of the vehicle 1200. In some embodiments the solar cells 1206 can be operatively coupled to the rechargeable power source to facilitate charging of the rechargeable power source by converting light into electricity. In some embodiments, the array of solar cells 1206 can be independent of the vehicle 1200 such that the solar cells can be disposed remote of the vehicle while being operatively coupled to the rechargeable power source.

In exemplary embodiments, the field vehicle 1200 can be a van (e.g., a Dodge Sprinter) that has a rear single-axle with two wheels. The van can have a gross vehicle weight rating (GVWR) of 8,550 pounds and a 3,500 pounds maximum payload as compared to a GVWR 19,500 pounds and a maximum payload of 11,000 pounds of trucks that were required to be used for convention resonant test systems. In exemplary embodiments, the resonant test system can weigh approximately 1,500 pounds (of which the resonant transformer comprises approximately 1,100 to 1,200 pounds of the 1,500 pound total) such that the resonant test system can be installed in any vehicle that supports a load of approximately 1,500 pounds including, for example, vehicles having a maximum payload of approximately 1,500 pounds.

Because exemplary embodiments can be installed in a smaller field vehicle than conventional resonant test systems, exemplary embodiments of the present disclosure can be implemented to realize lower operating cost and higher gas mileage as compared to convention systems, while also reducing wear and tear on the engine of the field vehicle 1200.

The above advantages of exemplary embodiments of the present disclosure can be realized, for example, because the size and weight of exemplary embodiments of the resonant transformers described herein can be reduced as compared to convention resonant transformers based on a positioning of the core segments with respect to the housing and the coil arrangements described herein. That is, by positioning one of the core segments external to the main housing of the resonant transformer the dimensions of the housing can be reduced and by using the coil arrangements described herein, likelihood of undesirable electrical discharges can be reduced to provide a stable resonant transformer that can operate without being enclosed in a housing that is filled with insulating oil as are conventional high voltage resonant transformers; thereby resulting in a significant weight reduction as compared to convention resonant transformers. Experimental data indicates that exemplary embodiments of the resonant transformer can have a total weight (including power supply and controls) that is less than approximately thirty-five percent (35%) to approximately sixty-five percent (65%) of the weight of an equivalent conventional resonant transformer. For example, an exemplary embodiment of the resonant transformer including two coils can weigh approximately 1,100 to approximately 1,200 pounds, while a conventional resonant transformer can weigh over 3,000 pounds. A reduction in size and weight of the resonant transformer can allow exemplary embodiments of the resonant transformer to be housed inside a small van rather than a medium size truck.

In addition to the recognized weight and size reduction recognized by exemplary embodiments of the present disclosure, exemplary embodiments of the resonant test system can also advantageously operate within a power frequency, while generating a resonance or near resonance condition with a wide range of capacitive loads (e.g. resonance can be achieved with small load capacitances, such as approximately 10 nanofarads and large load capacitances, such as approximately 800 nanofarads). As one non-limiting example, when the gap of the resonant transformer is set a minimum gap size, exemplary embodiments of the resonant transformers described herein can generate an inductance that has a value that significantly higher than conventional resonant transformers; allowing resonance to be achieved with very short cables. For example, due to the dielectric stability of the coil arrangements described herein, the coils of the resonant transformers can include a number of turns to generate a large enough inductance to form a resonant circuit with a load capacitance of ten (10) to twenty (20) nanofarads when the gap of the resonant transformer is set to a minimum gap size and the output frequency of the resonant test set is set between approximately fifty hertz (50 Hz) and sixty hertz (60 Hz). Such inductances are typically not achieved at power frequencies of 50 Hz to 60 Hz in commercially available conventional resonant transformers.

Figure 13:
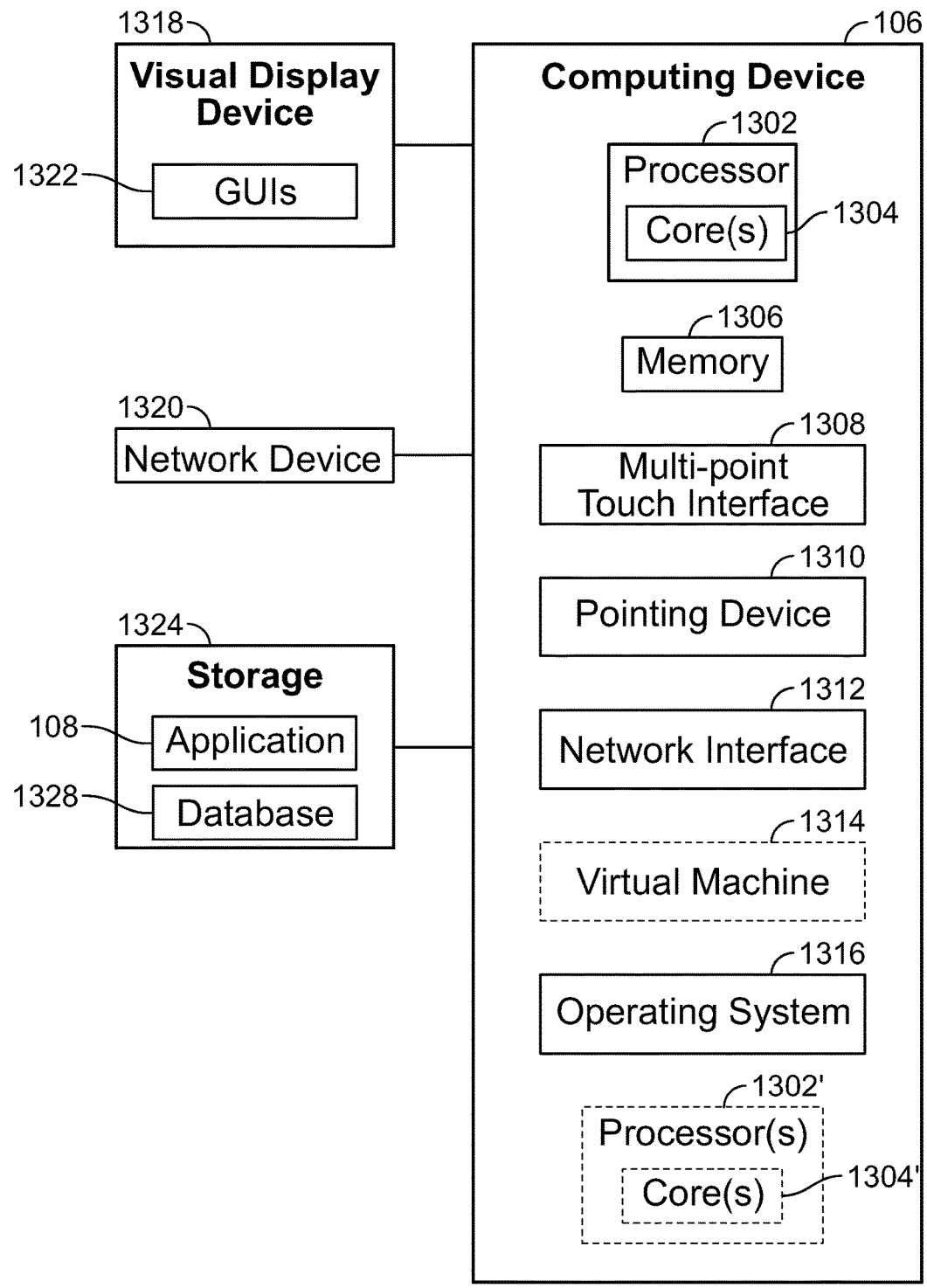
FIG. 13 is a block diagram of an exemplary embodiment of the computing device in accordance with exemplary embodiments of the present disclosure.

FIG. 13 is a block diagram of a an exemplary embodiment of the computing device 106 in accordance with exemplary embodiments of the present disclosure. The computing device 106 includes one or more non-transitory computer-readable media for storing one or more computer-executable instructions, code, or software for implementing exemplary embodiments described herein. For example, in some embodiments, a diagnostic testing application can be stored in the non-transitory computer-readable media. The non-transitory computer-readable media may include, but are not limited to, one or more types of hardware memory, non-transitory tangible media (for example, one or more magnetic storage disks, one or more optical disks, one or more flash drives), and the like. For example, memory 1306 included in the computing device 106 may store computer-readable and computer-executable instructions, code or software for generating a user interface, through a user performing diagnostic testing of electrical power cables, can interact with and/or control embodiments of the resonant test set 104 and/or to interact with a remote computing device, such as a server to upload/download data and/or to facilitate remote control of embodiments of the resonant test set 104. The computing device 106 also includes configurable and/or programmable processor 1302 and associated core 1304, and optionally, one or more additional configurable and/or programmable processor(s) 1302' and associated core(s) 1304' (for example, in the case of computer systems having multiple processors/cores), for executing computer-readable and computer-executable instructions, code, or software stored in the memory 1306 and other programs for controlling system hardware. Processor 1302 and processor(s) 1302' may each be a single core processor or multiple core (1304 and 1304') processor.

Virtualization may be employed in the computing device 106 so that infrastructure and resources in the computing device may be shared dynamically. A virtual machine 1314 may be provided to handle a process running on multiple processors so that the process appears to be using only one computing resource rather than multiple computing resources. Multiple virtual machines may also be used with one processor.

Memory 1306 may include a computer system memory or random access memory, such as DRAM, SRAM, MRAM, EDO RAM, and the like. Memory 1306 may include other types of memory as well, or combinations thereof.

A user may interact with the computing device 106 through a visual display device 1318, such as a computer monitor, which may be operatively coupled, indirectly or directly, to the computing device 106 to display one or more of the graphical user interfaces 1322 that can be provided in accordance with exemplary embodiments. The computing device 106 may include other I/O devices for receiving input from a user, for example, a keyboard or any suitable multi-point touch interface 1308, and a pointing device 1310 (e.g., a mouse). The keyboard 1308 and the pointing device 1310 may be coupled to the visual display device 1318. The computing device 106 may include other suitable conventional I/O peripherals.

The computing device 106 may also include or be operatively coupled to one or more storage devices 1324, such as a hard-drive, CD-ROM, or other computer readable media, for storing data and computer-readable instructions, executable code and/or software that implement exemplary embodiments of the diagnostic testing application 108 or portions thereof as well as associated processes described herein. For example, the computing device 106 can execute the instructions, code, and/or software to provide GUIs 1322 through which the user can interact with and/or control embodiments of the resonant test. Exemplary storage device 1324 may also store one or more databases for storing any suitable information required to implement exemplary embodiments. For example, exemplary storage device 1324 can store one or more databases 1328 for storing information, such as types of electrical cables and associated capacitances, results of diagnostic tests performed on electrical power cables, calibration/self-diagnostic data of the resonant test set, and/or any other suitable information/data that can be used or generated by embodiments of the resonant test system 100 described herein. The databases 1328 may be updated manually or automatically at any suitable time to add, delete, and/or update one or more items in the databases.

The computing device 106 can include a network interface 1312 configured to interface via one or more network devices 1320 with one or more networks, for example, Local Area Network (LAN), Wide Area Network (WAN) or the Internet through a variety of connections including, but not limited to, standard telephone lines, LAN or WAN links (for example, 802.11, T1, T3, 56 kb, X.25), broadband connections (for example, ISDN, Frame Relay, ATM), wireless connections, controller area network (CAN), or some combination of any or all of the above. The network interface 1312 may include a built-in network adapter, network interface card, PCMCIA network card, card bus network adapter, wireless network adapter, USB network adapter, modem or any other device suitable for interfacing the computing device 106 to any type of network capable of communication and performing the operations described herein. For example, in exemplary embodiments, the network interface can include an RF transceiver and an antenna to facilitate wireless communications between the computing device 106 and other device (e.g., servers 1410-1411 and databases 1430-1431 of FIG. 14) via the communications network 950. Moreover, the computing device 106 may be any computer system, such as a workstation, desktop computer, server, laptop, handheld computer, tablet computer (e.g., the iPad™ tablet computer), mobile computing or communication device (e.g., the iPhone™ communication device), point-of sale terminal, internal corporate devices, or other form of computing or telecommunications device that is capable of communication and that has sufficient processor power and memory capacity to perform the processes and/or operations described herein.

The computing device 106 may run any operating system 1316, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, or any other operating system capable of running on the computing device and performing the processes and/or operations described herein. In exemplary embodiments, the operating system 1316 may be run in native mode or emulated mode. In an exemplary embodiment, the operating system 1316 may be run on one or more cloud machine instances.

While an exemplary embodiment of the computing device 106 is described herein to include certain components, those skilled in the art will recognize that the computing device 106 may include more or fewer components. Furthermore, one skilled in the art will recognize that any computing device that can be programmed and/or configured to interact with and/or control embodiments of the resonant test set 104 or portions thereof.

Figure 14:
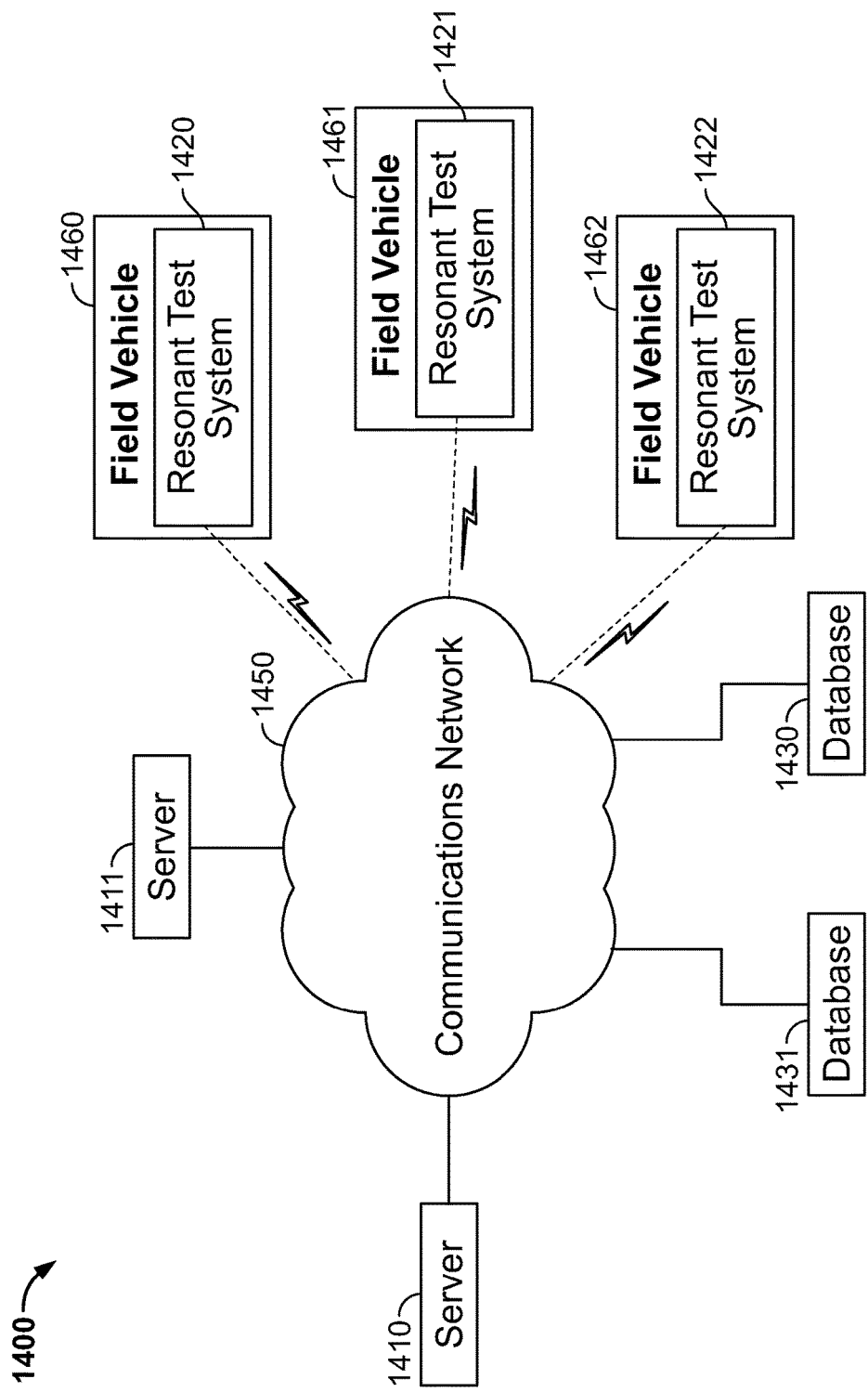
FIG. 14 depicts an exemplary networked communication environment that can be utilized to implement exemplary embodiments of the present disclosure.

FIG. 14 depicts an exemplary networked communication environment 1400 that can be utilized to implement exemplary embodiments of the present disclosure. The environment 1400 includes servers 1410-1411 operatively coupled to resonant test systems 1420-1422 (embodiments of the resonant test system 100), via a communication network 1450, which can be any network over which information can be transmitted between devices communicatively coupled to the network. For example, the communication network 1450 can be the Internet, an Intranet, virtual private network (VPN), wide area network (WAN), local area network (LAN), and the like. The environment 1400 can include repositories or databases 1430-1431, which can be operatively coupled to the servers 1410-1411, as well as to resonant test systems 1420-1422, via the communications network 1450. The servers 1410-1411 and databases 1430-1431 can be implemented as computing devices. Those skilled in the art will recognize that the database devices 1430-1431 can be incorporated into one or more of the servers 1410-1411 such that one or more of the servers can include databases.

The databases 1430-1431 can store information for use by the resonant test systems 1420-1422. For example, the database 1430 can store information related to types of electrical power cables as well as test profiles for the types of electrical cables, and the database 1431 can store information related to the results of diagnostic tests performed by the resonant test systems 1420-1422.

In exemplary embodiments, the resonant test systems 1420-1422 can be operator by users to perform diagnostic field testing of electrical power cables. For example, the resonant test systems 1420-1422 can be installed in field vehicles 1460-1462, respectively, which can transport the resonant test systems to different geographic areas. Once at the test location, the users can operatively couple an electrical power cable to be tested to the resonant test system as described herein. The user can interface with the computing device of the resonant test system to specify information related to the electrical power cable via a user interface and can initiate diagnostic testing of the electrical power cable via the resonant test set. Upon completion of (or during) a diagnostic test, data associated with the results of tests can be transmitted, wirelessly or through wires, from the resonant test systems to the server 1410, via the communications network 1450. The server 1410 can process the data and/or store the data in the database 1431. For example, in exemplary embodiments, the server 1410 can be programmed to execute one or more processes to determine whether electrical power cables that have been tested have undesirable electrical discharges and/or can identify a location of such electrical discharges.

In some embodiments, the server 1411 can be programmed to facilitate remote control of one or more or the resonant test systems. Such that the user can communicate with the server to indicate that the electrical power cable has been connected and/or to provide information about the electrical power cable, which can be utilized by the server 1411 when implementing a diagnostic test on the electrical power cable. The server 1411 can remotely control one or more of the resonant test systems 1420-1422 to perform diagnostic testing of cables and to facilitate transmission of data associated with the results of the diagnostic testing to the server 1411 for processing by the server 1411 and/or by the server 1410, and/or to be stored in the database 1431.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step.

Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other embodiments, functions and advantages are also within the scope of the invention.

The invention claimed is:

1. A method of conducting diagnostic testing of electrical cables using a resonant test set, the method comprising:
   adjusting an inductance of the resonant test set to set the inductance of the resonant test set to a fixed test inductance value;
   adjusting an output frequency of the resonant test set to set the output frequency to a fixed test frequency, the fixed test inductance value and the fixed test frequency being sequentially adjusted and set to achieve resonance in series with a an electrical cable under test; and
   performing diagnostic testing of the electrical cable with the resonant test set at the fixed test inductance value and the fixed test frequency value.

2. The method of claim 1, further comprising:
   setting the output frequency of the resonant test set to a first frequency value prior to adjusting the inductance of the resonant test set.

3. The method of claim 2, wherein the resonant test set includes an inverter and setting the output frequency comprises:
   controlling the output frequency of the inverter by a processing device to output the first frequency value from the inverter;
   receiving a feedback signal associated with the output from the inverter;
   determining whether the feedback signal corresponds to the first frequency value; and
   adjusting the output frequency of the inverter to be the first frequency value in response to determining that the feedback signal does not correspond to the first frequency value.

4. The method of claim 2, further comprising:
   estimating a capacitance of the electrical cable prior to adjusting the inductance of the resonant test set in response to at least one of user input or electrical measurement of the electrical cable,
   wherein the fixed test inductance value is determined at least in part based on the estimated capacitance and the first frequency value.

5. The method of claim 1, wherein the resonant test set includes a reactor and adjusting the inductance of the resonant test set comprises:
   receiving feedback signals associated with the inductance of the reactor by a processing device;
   adjusting the inductance of the reactor based on the feedback signals;
   determining, by the processor, as the inductance is being adjusted, whether the feedback signals correspond to a minimum phase angle between an output voltage and an output current of the resonant test set based on the feedback signals; and
   in response to determining that the feedback signals correspond to the minimum phase angle, setting the fixed test inductance value to the inductance at which the feedback signals correspond to the minimum phase angle.

6. The method of claim 1, wherein the resonant test set comprises a reactor having a split magnetic core including a first core segment and a second core segment that is moveable with respect to the first core segment and adjusting the inductance of the resonant test set comprises:
   receiving control signals from a processing device by an actuator of the reactor, the actuator being controlled by the control signal to adjust a distance between the first and second core segments until the fixed test inductance value is achieved.

7. The method of claim 6, wherein the distance between the first and second core segment is adjustable between approximately a tenth of a centimeter and approximately five centimeters.

8. The method of claim 7, wherein the inductance of the reactor is approximately four hundred Henries when the distance is set to approximately one tenth of a centimeter and is approximately fifteen Henries when the distance is set to approximately five centimeters.

9. The method of claim 1, wherein the resonant test set includes an inverter for generating the output frequency and adjusting the output frequency of the resonant test set comprises:
   decreasing or increasing the output frequency of the inverter from the first frequency value in response to control signals received from a processing device until resonance is achieved.

10. The method of claim 1, wherein the resonant test set is configured to operate in a power frequency range of approximately fifty hertz to approximately sixty hertz.

11. The method of claim 1, wherein the resonant test set is configured to output a voltage between approximately twenty-five kilovolts and approximately two hundred fifty kilovolts.

12. The method of claim 1, wherein performing diagnostic testing of the electrical cable comprises performing a partial discharge test on the electrical cable.

13. A resonant test system for diagnostic testing of electrical cables, the resonant test system comprising:
   an inverter configured to receive a direct current (DC) voltage at an input and to output an alternating current (AC) voltage at an output;
   an exciter operatively coupled to the inverter, the exciter amplifying an amplitude of the AC voltage;
   a reactor having an input that is operatively coupled to the exciter and an output that is configured to be operatively coupled to an electrical cable; and
   a processing device operatively coupled to the inverter and the reactor, the processing device being programmed to:
   sequentially adjust and set an inductance of the reactor and an output frequency of the inverter to fixed values to achieve resonance in series with the electrical cable; and
   perform diagnostic testing of the electrical cable with the inductance of the reactor and the output frequency of the inverter set to the fixed values.

14. The resonant test system of claim 13, further comprising:
   a DC power source operatively coupled to the input of the inverter.

15. The resonant test system of claim 13, wherein the DC power source is a rechargeable battery configured to be recharged by an operation of a combustion engine.

16. The resonant test system of claim 13, further comprising:

a filter operatively coupled to, and in series with, the output of the inverter and an input of the exciter, the filter being configured to filter the output of inverter.

17. The resonant test system of claim 13, wherein the inverter is configured to receive a rectified AC voltage from an AC power outlet.

18. The resonant test system of claim 13, wherein the processing device is programmed to set an output frequency of the resonant test set to a first frequency value prior to adjusting the inductance of the resonant test set.

19. The resonant test system of claim 18, wherein the processing device is programmed to set the output frequency of the inverter to the first frequency value by controlling the output frequency of the inverter by a processing device to output from the inverter the first frequency value; receiving a feedback signal associated with the output from the inverter; determining whether the feedback signal corresponds to the first frequency value; and adjusting the output frequency of the inverter to be the first frequency value in response to determining that the feedback signal does not correspond to the first frequency value.

20. The resonant test system of claim 18, wherein the processing device is programmed to estimate a capacitance of the electrical cable prior to adjusting the inductance of the resonant test set, the processing device estimating the capacitance in response to at least one of user input or electrical measurement of the electrical cable,
wherein processing device adjusts and sets the fixed test inductance value at least in part based on the estimated capacitance and the first frequency value.

21. The resonant test system of claim 13, wherein the processing device is programmed to:
receive feedback signals associated with the inductance of the reactor;
adjust the inductance of the reactor based on the feedback signals;
determine, as the inductance is being adjusted, whether the feedback signals correspond to a minimum phase angle between an output voltage and an output current of the resonant test set based on the feedback signals; and
in response to determining that the feedback signals correspond to the minimum phase angle, setting the fixed test inductance value to the inductance at which the feedback signals correspond to the minimum phase angle.

22. The resonant test system of claim 13, wherein the reactor has a split magnetic core including a first core segment and a second core segment that is moveable with respect to the first core segment,
wherein the processing device is programmed to adjust the inductance of the resonant test controlling an actuator of the reactor, the actuator being controlled by the control signal to adjust a distance between the first and second core segments until the test inductance value is achieved.

23. A non-transitory computer-readable medium storing instructions, wherein execution of the instructions by a processing device causes the processing device to implement a process for diagnostic testing of an electrical cable, the process implemented upon execution of the instructions comprising:
setting an output frequency of a resonant test set to a first frequency value;
adjusting an inductance of the resonant test set to set the inductance of the resonant test set to a fixed test inductance value;
adjusting the output frequency of the resonant test set to set the output frequency to a fixed test frequency, the fixed test inductance value and the fixed test frequency being sequentially adjusted and set to achieve resonance in series with an electrical cable under test; and
performing diagnostic testing of the electrical cables with the resonant test set at the test inductance value and the test frequency value.

24. The medium of claim 23, wherein the resonant test set includes a reactor and adjusting the inductance of the resonant test set comprises:
receiving feedback signals associated with the inductance of the reactor by a processing device;
adjusting the inductance of the reactor based on the feedback signals;
determining, as the inductance is being adjusted, whether the feedback signals correspond to a minimum phase angle between an output voltage and an output current of the resonant test set based on the feedback signals; and
in response to determining that the feedback signals correspond to the minimum phase angle, setting the fixed test inductance value to the inductance at which the feedback signals correspond to the minimum phase angle.

25. The medium of claim 23, wherein the resonant test set comprises a reactor having a split magnetic core including a first core segment and a second core segment that is moveable with respect to the first core segment and adjusting the inductance of the resonant test set comprises:
receiving control signals from a processing device by an actuator of the reactor, the actuator being controlled by the control signal to adjust a distance between the first and second core segments until the fixed test inductance value is achieved.

26. The medium of claim 23, wherein the resonant test set includes an inverter for generating the output frequency and adjusting the output frequency of the resonant test set comprises:
decreasing or increasing the output frequency of the inverter in response to control signals received from a processing device until resonance is achieved.

27. A method of conducting diagnostic testing of electrical cables using a resonant test set, the method comprising:
adjusting an inductance of the resonant test set to set the inductance of the resonant test set to a test inductance value;
adjusting an output frequency of the resonant test set to set the output frequency to a test frequency, the test inductance value and the test frequency being set to achieve resonance in series with a an electrical cable under test; and
performing diagnostic testing of the electrical cable with the resonant test set at the test inductance value and the test frequency value,
wherein the resonant test set includes a reactor and adjusting the inductance of the resonant test set comprises:
receiving feedback signals associated with the inductance of the reactor by a processing device;
adjusting the inductance of the reactor based on the feedback signals;
determining, by the processor, as the inductance is being adjusted, whether the feedback signals correspond to a minimum phase angle between an output voltage and an output current of the resonant test set based on the feedback signals; and in response to determining that the feedback signals correspond to the minimum phase angle, setting the test inductance value to the inductance at which the feedback signals correspond to the minimum phase angle.

28. A non-transitory computer-readable medium storing instructions, wherein execution of the instructions by a processing device causes the processing device to implement a process for diagnostic testing of an electrical cable, the process implemented upon execution of the instructions comprising:
   setting an output frequency of a resonant test set to a first frequency value;
   adjusting an inductance of the resonant test set to set the inductance of the resonant test set to a test inductance value;
   adjusting the output frequency of the resonant test set to set the output frequency to a test frequency, the test inductance value and the test frequency being set to achieve resonance in series with an electrical cable under test; and
   performing diagnostic testing of the electrical cables with the resonant test set at the test inductance value and the test frequency value,
   wherein the resonant test set includes a reactor and adjusting the inductance of the resonant test set comprises:
      receiving feedback signals associated with the inductance of the reactor by a processing device;
      adjusting the inductance of the reactor based on the feedback signals;
      determining, as the inductance is being adjusted, whether the feedback signals correspond to a minimum phase angle between an output voltage and an output current of the resonant test set based on the feedback signals; and
      in response to determining that the feedback signals correspond to the minimum phase angle, setting the test inductance value to the inductance at which the feedback signals correspond to the minimum phase angle.

29. A resonant test system for diagnostic testing of electrical cables, the resonant test system comprising:
   an inverter configured to receive a direct current (DC) voltage at an input and to output an alternating current (AC) voltage at an output;
   an exciter operatively coupled to the inverter, the exciter amplifying an amplitude of the AC voltage;
   a reactor having an input that is operatively coupled to the exciter and an output that is configured to be operatively coupled to an electrical cable; and
   a processing device operatively coupled to the inverter and the reactor, the processing device being programmed to:
   sequentially adjust and set an inductance of the reactor and an output frequency of the inverter to achieve resonance in series with the electrical cable; and
   perform diagnostic testing of the electrical cable with the inductance of the reactor and the output frequency of the inverter set to achieve resonance,
   wherein the processing device is programmed to:
      receive feedback signals associated with the inductance of the reactor;
      adjust the inductance of the reactor based on the feedback signals;
      determine, as the inductance is being adjusted, whether the feedback signals correspond to a minimum phase angle between an output voltage and an output current of the resonant test set based on the feedback signals; and
      in response to determining that the feedback signals correspond to the minimum phase angle, setting the test inductance value to the inductance at which the feedback signals correspond to the minimum phase angle.

* * * * *